United States Patent
Pelley

(10) Patent No.: US 9,208,856 B2
(45) Date of Patent: Dec. 8, 2015

(54) MULTIPORT MEMORY WITH MATCHING ADDRESS CONTROL

(71) Applicant: Perry H. Pelley, Austin, TX (US)

(72) Inventor: Perry H. Pelley, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 311 days.

(21) Appl. No.: 13/795,789

(22) Filed: Mar. 12, 2013

(65) Prior Publication Data

US 2014/0269016 A1    Sep. 18, 2014

(51) Int. Cl.
| | |
|---|---|
| G11C 8/00 | (2006.01) |
| G11C 11/418 | (2006.01) |
| G11C 11/419 | (2006.01) |
| G11C 8/16 | (2006.01) |

(52) U.S. Cl.
CPC ............... *G11C 11/418* (2013.01); *G11C 8/16* (2013.01); *G11C 11/419* (2013.01)

(58) Field of Classification Search
USPC .................. 365/189.04, 230.05, 156, 189.08
See application file for complete search history.

(56) References Cited

U.S. PATENT DOCUMENTS

| | | | |
|---|---|---|---|
| 5,781,480 A | 7/1998 | Nogle et al. | |
| 6,181,634 B1 | 1/2001 | Okita | |
| 6,473,357 B1 | 10/2002 | Fan et al. | |
| 6,625,699 B2 | 9/2003 | Cohen et al. | |
| 6,816,955 B1 | 11/2004 | Raza et al. | |
| 6,845,059 B1 | 1/2005 | Wordeman et al. | |
| 6,873,565 B1 | 3/2005 | Riedlinger et al. | |
| 7,054,217 B2 | 5/2006 | Yamada | |
| 7,184,359 B1 | 2/2007 | Bridgewater et al. | |
| 7,206,251 B1 | 4/2007 | Yu | |
| 7,533,222 B2 | 5/2009 | Leung | |
| 7,564,738 B2 * | 7/2009 | Pelley et al. | 365/233.13 |
| 7,573,753 B2 | 8/2009 | Atwood et al. | |
| 7,808,847 B2 | 10/2010 | Wang et al. | |
| 7,894,296 B2 | 2/2011 | Lee et al. | |
| 7,940,599 B2 | 5/2011 | Lu et al. | |
| 2005/0270885 A1 * | 12/2005 | Masuo | 365/230.05 |
| 2009/0052262 A1 * | 2/2009 | Nii | 365/189.14 |

OTHER PUBLICATIONS

Chang, M. et al., "Wide VDD Embedded Asynchronous SRAM With Dual-Mode Self-Timed Technique for Dynamic Voltage Systems", IEEE Transactions on Circuits and Systems I: Regular Papers, vol. 56, No. 8, Aug. 2009, pp. 1657-1667/.

Endo, K. et al., "Pipelined, Time-Sharing Access Technique for an Integrated Multiport Memory", IEEE Journal of Solid-State Circuits, vol. 26, No. 4, Apr. 1991, pp. 549-554.

(Continued)

*Primary Examiner* — Huan Hoang
*Assistant Examiner* — Minh Dinh

(57) ABSTRACT

A multiport SRAM has an array of cells, a first port, and a second port. During a period of different row addresses for the ports, the first port uses first word lines and first bit lines. The second port uses second word lines and second bit lines. In response to the second port switching to the same address as the first port to make a row match, the second port and the first port use the first plurality of word lines, but the first port uses the first plurality of bit lines and the second port uses the second plurality of bit lines. If the row match is removed by the first port changing row addresses, a correlation swap is performed so that the first port performs accesses using the second word lines and bit lines and the second port performs accesses using the first word lines and bit lines.

20 Claims, 8 Drawing Sheets

(56) References Cited

OTHER PUBLICATIONS

Ishii, Y. et al., "A 28-nm dual-port SRAM macro with active bitline equalizing circuitry against write disturb issue", 2010 IEEE Symposium on VLSI Circuits, Jun. 16-18, 2010, pp. 99-100.
Johnston, C.T., et al., "FPGA implementation of a Single Pass Connected Components Algorithm", 4th IEEE International Symposium on Electronic Design, Test & Applications, May 2008, pp. 228-231.
Lee, H., "Design of Ultra Low Power Pseudo-Asynchronous SRAM", Twelfth Annual IEEE International ASIC/SOC Conference, Sep. 15-18, 1999, p. 275.
Muttersbach, J. et al., "Globally-Asynchronous Locally-Asynchronous Architectures to Simplify the Design of On-Chip Systems", Twelfth Annual IEEE International ASIC/SOC Conference, 1999, pp. 317-321.
Nakase, Y. et al., "A 300MHz Dual Port Graphics RAM using Port Swap Architecture", ISSCC97/Session 24/Non-Volatile Memory and SRAM/Paper SP 24.3, IEEE International Solid State Circuits Conference, Feb. 8, 1997, pp. 400-401.
Nii, K. et al., "Synchronous Ultra-High-Density 2RW Dual-Port 8T-SRAM with Circumvention of Simultaneous Common-Row-Access", IEEE Journal of Solid-State Circuits, vol. 44, No. 3, Mar. 2009, pp. 977-986.
Pilo, H. et al., "A 5.6ns Random Cycle 144Mb DRAM with 1.4b/s/pin and DDR3-SRAM Interface", ISSCC 2003/Session 17/SRAM and DRAM/Paper 17.5, IEEE International Solid-State Circuits Conference, Feb. 12, 2003, 11 pgs.
Soon-Hwei, T. et al., "A 160-Mhz 45-mW Asynchronous Dual-Port 1-Mb CMOS SRAM", 2005 IEEE Conference on Electronic Devices and Solid-State Circuits, Dec. 19-21, 2005, pp. 351-354.
U.S. Appl. No. 13/740,862, Pelley, P.H., "Multiport Memory With Matching Address and Data Line Control", filed Jan. 14, 2013.
U.S. Appl. No. 13/740,868, Pelley, P.H., "Multiport Memory With Matching Address Control", filed Jan. 14, 2013.
U.S. Appl. No. 13/483,764, Pelley, P.H., et al., "Multi-Port Register File with Multiplexed Data", filed May 30, 2012.
U.S. Appl. No. 13/873,988, Pelley, P.H., "Synchronous Multiple Port Memory With Asynchronous Ports", filed Apr. 30, 2013.

* cited by examiner

# MULTIPORT MEMORY WITH MATCHING ADDRESS CONTROL

BACKGROUND

1. Field

This disclosure relates generally to semiconductor devices, and more specifically, to multiport semiconductor memory devices.

2. Related Art

Along with recent advancements of semiconductor technologies, smaller-size and larger-capacity memories that allow high-speed reading/writing operations have been developed. Further, a so-called multiport memory including plural input ports and output ports has been used for reading/writing data of different addresses.

Multi-port memories, by providing access to the storage element of memory cells (otherwise known as bit cells) to more than one resource, such as in the case of multi-core processor or an interface between a processor and a bus, have become more commonly used. One of the issues with multi-port memories is how to coordinate this aspect of providing access to more than one resource. Often this ability is achieved using wait states and/or arbitration. This can result in unpredictable access times which is undesirable. Furthermore, in some scenarios, it is necessary for a multiport memory to interface to other logic units having different operating frequencies.

Accordingly there is a need for a multi-port memory that improves upon one or more of the issues discussed above.

BRIEF DESCRIPTION OF THE DRAWINGS

The present disclosure is illustrated by way of example and is not limited by the accompanying figs, in which like reference numbers indicate similar elements. Elements in the figures are illustrated for simplicity and clarity and have not necessarily been drawn to scale.

DETAILED DESCRIPTION

Figure 1:
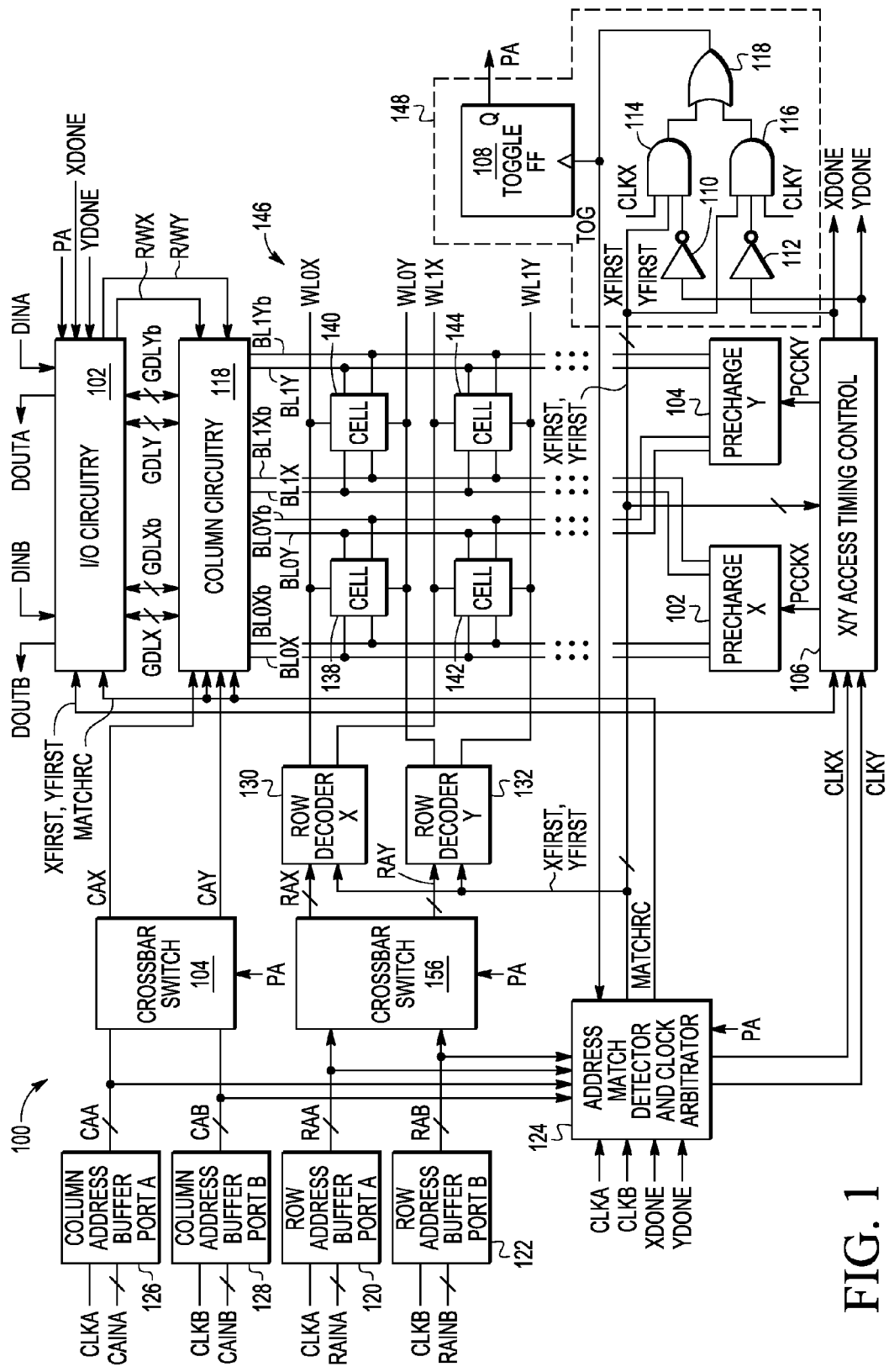
FIG. 1 is a block diagram of a multi-port memory according to an embodiment.

In one aspect, a multiple port memory (i.e. a multiport memory) supports simultaneous read and write accesses. For example, the multiport memory may be a dual port memory having ports A and B, in which each of ports A and B can process an access request simultaneously. For example, in one embodiment, the multiport memory can include an array of bit cells which is independently addressable by first circuitry, which may be referred to as X-circuitry, and second circuitry, which may be referred to as Y-circuitry. The X-circuitry may include corresponding word lines and bit line pairs coupled to the array of bit cells, along with corresponding access and control circuitry, and the Y-circuitry may include corresponding word lines and bit line pairs coupled to the array of bit cells, along with corresponding access and control circuitry. In this manner, each bit cell of the array can either be accessed by the X-circuitry or the Y-circuitry. The X-circuitry operates in accordance with a corresponding clock (CLKX), and the Y-circuitry operates in accordance with a corresponding clock (CLKY). CLKX and CLKY may be asynchronous to each other. That is, they may be out of phase with each other and/or have different frequencies.

In one embodiment, port assignment control circuitry within the multiport memory is used to assign which of the X-circuitry or Y-circuitry is used to process access requests from port A or port B. Either of X-circuitry or Y-circuitry can be assigned by the port assignment control circuitry to process access requests from either port A or port B. Note that if the X-circuitry is assigned to process requests from port A, then the Y-circuitry is assigned to process requests from port B, and vice versa. For example, in the former case, the word lines and bit line pairs corresponding to the X-circuitry are used to access the bit cells for the read or write request from port A and the word lines and bit line pairs corresponding to circuitry Y are used to access the bit cells for the read or write request from port B. In one embodiment, X-circuitry is able to process an access received at its assigned port within one cycle of CLKX and Y-circuitry is able to process an access received at its assigned port within one cycle of CLKY.

No conflict arises so long as different rows are being accessed by each port. However, when the same row is addressed by the access requests on ports A and B (but different bit cells, i.e. columns, within the same row are being addressed by the access requests), a bit line pair and selected word line of only one of the X-circuitry or Y-circuitry is used to access the bit cells. In this situation, the bit line pair of the other of the X-circuitry or Y-circuitry is kept decoupled from the bit cells and the word line of the other of the X-circuitry or Y-circuitry is kept disabled. In this manner, the capacitance of the bit line pair of the circuitry not being used to access the bit cells is kept from adversely impacting the access to the selected bit cells. However, upon port A or B receiving a subsequent access request to a different row, the port assignment control circuitry may "swap" or "toggle" the assignments of the X and Y circuitry in order to take advantage of the X or Y circuitry that was not being used for the previous access request. If the X-circuitry was assigned to port A and the Y-circuitry to port B, a "swap" or "toggle" would result in X-circuitry being assigned to port B and the Y-circuitry being assigned to port A. The port assignment control circuitry, based on a variety of conditions, can determine when this port assignment swap should be performed.

For example, if the X-circuitry is assigned to port A and is currently processing an access request from port A, and an access request is received from port B which also addressees the same row, the X-circuitry will be "shared" to process both the access from port A and the access from port B, even though the Y-circuitry is currently assigned to port B. This "sharing" results in the word lines and bit lines of the X-circuitry being used to access the bit cells addressed by the access request from port A as well to access the bit cells addressed by the access request from port B. At this point, note that the Y-circuitry is not being utilized to access the array. A subsequent access request on port A may address a different row; however, the X-circuitry which is still assigned to port A may not be available because it may still be processing access requests from port B. Therefore, in this situation, the port assignment control circuitry may swap the assignments such that the X-circuitry is assigned to continue processing the access request and subsequent access requests from port B, and the Y-circuitry is assigned to process access requests from port A. In this manner, the subsequent access request received at port A can be immediately processed using the Y-circuitry, which B was not using due to "sharing" the X-circuitry for the same row access. This "swapping" as well as other aspects of the multiport memory will be further understood in reference to the drawings and the following description.

Shown in FIG. 1 is a memory 100 having an array 146, a column address buffer port A 126, a column address buffer port B 128, a crossbar switch 104, a row address buffer port A 120, a row address buffer port B 122, a crossbar switch 156, a row decoder X 130, a row decoder Y 132, I/O circuitry 102, column circuitry 118, an address match detector and clock arbitrator 124, precharge circuit X 162, precharge circuit Y 166, port assignment (PA) control circuitry 148, and X/Y access timing control 106. Array 146 comprises bit cells 138, 140, 142, and 144.

PA control circuit 148 of memory 100 outputs a port assignment control signal, PA, which indicates which circuitry is assigned to which port (i.e. which circuitry is correlated to which port). In the descriptions herein, it will be assumed that when PA control circuitry 148 outputs PA as a logic level one, the X-circuitry is assigned to (i.e. correlated to) port A and the Y-circuitry is assigned to (i.e. correlated to) port B, and when PA is output as a logic level zero, the X-circuitry is assigned to (i.e. correlated to) port B and the Y-circuitry is assigned to (i.e. correlated to) port A. Therefore, based on the PA signal, the X or Y circuitry can either be assigned to process the access requests from either port A or port B. Alternate embodiments may assign the X-circuitry to port A when PA is a logic level zero and to port B when PA is a logic level one. Therefore, the PA signal provides the correlation between the X and Y circuitries and the ports. As will be described below, PA will be used by the crossbar switches to appropriately route port A and port B signals to the corresponding assigned X or Y circuitry. In one embodiment, the X-circuitry includes the X word lines, WL0X, WL1X, etc., the X bit lines, BL0X, BL0Xb, BL1X, BL1Xb, row decoder X 130, precharge X 162, and any other circuitry within column circuitry 118, I/O circuitry 102, and X/Y access timing control 106 used to access the bit cells of array 146 using the X word lines and X bit line pairs. In one embodiment, the Y-circuitry includes the Y word lines, WL1Y, WL1Y, etc., the Y bit lines, BL0Y, BL0Yb, BL1Y, BL1Yb, row decoder Y 132, precharge Y 166, and any other circuitry within column circuitry 118, I/O circuitry 102, and X/Y access timing control 106 used to access the bit cells of array 146 using the Y word lines and Y bit line pairs.

Column address buffer port A 126 receives a port A clock signal (CLKA) and a port A input column address (CAINA), and provides a buffered port A column address (CAA) to crossbar switch 104. Similarly, column address buffer port B 128 receives a port B clock signal (CLKB) and a port B input column address (CAINB), and provides a buffered port B column address (CAB) to crossbar switch 104. Based on PA, crossbar switch 104 provides CAA as column address X (CAX) or column address (Y) to column circuitry 118 and CAB as CAX or CAY to column circuitry 118. For example, if PA is a logic level one, CAA is provided as CAX and CAB as CAY, and if PA is a logic level zero, CAA is provided as CAY and CAB as CAX. Row address buffer port A 120 receives CLKA and a port A input row address (RAINA), and provides a buffered port A row address (RAA) to crossbar switch 156. Similarly, row address buffer port B 122 receives CLKB and a port B input row address (RAINB), and provides a buffered port B row address (RAB) to crossbar switch 156. Based on PA, crossbar switch 156 provides RAA as RAX or RAY to row decoder X 130 or row decoder Y 132, and RAB as RAX or RAY to row decoder X 130 or row decoder Y 132. For example, if PA is a logic level one, RAA is provided as RAX to row decoder X 130 and RAB is provided as RAY to row decoder Y 132, and if PA is a logic level zero, RAA is provided as RAY to row decoder Y 132 and RAB is provided as RAX to row decoder X 130. Therefore, port A and port B can either be processed by the X-circuitry portion and Y-circuitry portion of memory 100, respectively, or the Y-circuitry portion and the X-circuitry portion of memory 100, respectively, based on the value of PA.

Figure 8:
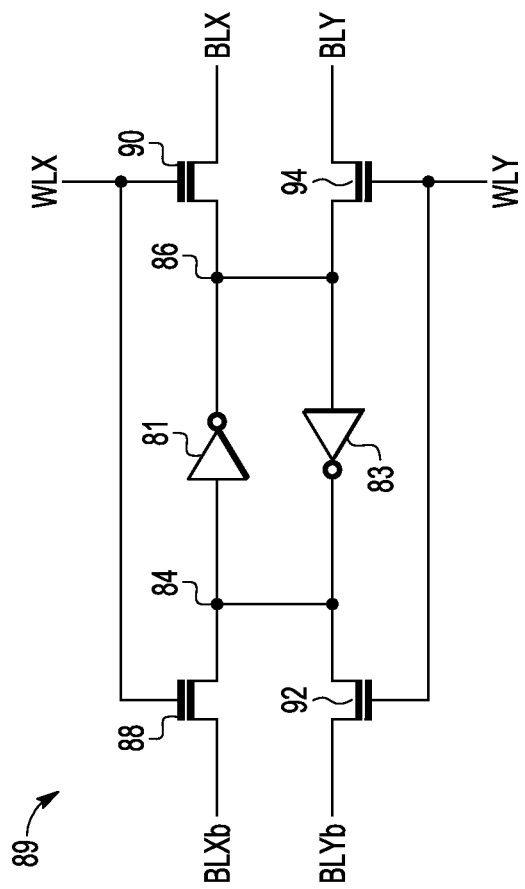
FIG. 8 is a circuitry diagram of a memory cell of the multi-port memory of FIG. 1 according to an embodiment.

Shown in FIG. 8 is a circuit diagram of an exemplary memory cell 89 which is exemplary for the other bit cells of array 146 such as memory cells 138, 140, 142, and 144. Bit cell 138, which is a static random access memory (SRAM) cell, comprises inverters 80 and 82 connected to nodes 84 and 86 and transistors 88, 90, 92, and 94 which are N channel transistors in this example. Inverter 81 has an input connected to node 84 and an output connected to node 86. Inverter 83 has an input connected to node 86 and an output connected node 84. Nodes 84 and 86 are storage nodes of memory cell 138. Transistor 88 has a first current electrode connected to node 84, a control electrode connected to word line WLX which is a word line of the X-circuitry, and a second current electrode connected to bit line BLXb which is a complementary bit line of the X-circuitry. Transistor 90 has a first current electrode connected to node 86, a control electrode connected to word line WLX, and a second current electrode connected to bit line BLX which is a true bit line of the X-circuitry. Transistor 92 has a first current electrode connected to node 84, a control electrode connected to a word line WLY, which is a word line of the Y-circuitry, and a second current electrode connected to complementary bit line BLYb of the Y-circuitry. Transistor 94 has a first current electrode connected to node 86, a control electrode connected to word line WLY, and true bit line BLY of the Y-circuitry. Nodes 84 and 86 are storage nodes that are accessed through transistors 88 and 92 for node 84 and transistors 90 and 94 for node 86. Inverters 81 and 83 together may be considered a storage latch. Transistors 90 and 88 are enabled when memory cell 89 is selected by the X-circuitry and for coupling the storage nodes to the bit line pair (BLX, BLXb) of the X-circuitry. Transistors 92 and 94 are enabled when memory cell 89 is selected by the Y-circuitry. In this example the bit lines are used for either writing to storage nodes 84 and 86 or reading from storage nodes 84 and 86. The word lines are for enabling the coupling between storage nodes and bit lines. The control electrodes of transistors 88 and 90 may be considered X enable inputs corresponding to the X-circuitry and the control electrodes of transistors 92 and 94 may be considered Y enable inputs corresponding to the Y-circuitry. The second current electrodes of transistors 88 and 90 may be considered X access nodes corresponding to the X-circuitry, and the second current electrodes of transistors 92 and 94 may be considered Y access nodes corresponding to the Y-circuitry. In this manner, memory cell 89 can be accessed by way of the X-circuitry (using WLX, BLX, and BLXb) or by way of the Y-circuitry (using WLY, BLY, and BLYb).

Array 146 includes more than the four bit cells, which may be called memory cells, shown as memory cells 138, 140, 142, and 144 in FIG. 1 and accordingly more bit line pairs and word lines than shown. Memory cells 138 and 140 have their X enable inputs connected to word line WL0X and their Y enable inputs connected to word line WL0Y. The X access nodes of memory cell 138 are connected to true and complementary bit lines BL0X and BL0Xb, and the Y access nodes are connected to true and complementary bit lines BL0Y and BL0Yb. The X access nodes of memory cell 140 are connected to true and complementary bit lines BL1X and BL1Xb, and the Y access nodes are connected to true and complementary bit lines BL1Y and BL1Yb. Memory cells 142 and 144 have their X enable inputs connected to word line WL1X and their Y enable inputs connected to word line WL1Y. The X access nodes of memory cell 142 are connected to true and complementary bit lines BL0X and BL0Xb and the Y access nodes for are connected to true and complementary bit lines BL0Y and BL0Yb. The X access nodes of memory cell 144 are connected to true and complementary bit lines BL1X and BL1Xb, and the Y access nodes are connected to true and complementary bit lines BL1Y and BL1Yb.

RAX provides true and complementary row address signals which are routed to the X-circuitry from either port A or port B. RAY provides true and complementary row address signals which are routed to the Y-circuitry from either port A or port B. Row decoder X 130 is coupled to the combination of true and complementary address signals of RAX, and row decoder Y 132 is coupled to the combination of true and complementary address signals of RAY. Row decoder X 130 is coupled to each of the X word lines (WL0X, WL1X, etc.), and when row decoder X 130 outputs a logic level high for a word line, that word line is selected. Row decoder Y 132 is coupled to each of the Y word lines (WL0Y, WL1Y, etc.), and when row decoder Y 132 outputs a logic level high for a word line, that word line is selected.

Column circuitry 118 is coupled to bit lines BL0X, BL0Xb, BL0Y, BL0Yb, BL1X, BL1Xb, BL1Y, and BL1Yb, and in response to column addresses CAX and CAY, selects among these bit lines to sense data at the selected bit lines and couple the sensed data to global data lines GDLX for the X-circuitry and GDLY for the Y-circuitry or to provide write data from GDLX and GDLY to the selected bit lines for storage into array 146. True and complementary bit lines of the same circuitry connected to the same column of cells may be referenced as a bit line pair. For example, bit lines BL0X and BL0Xb form a bit line pair. Similarly, data lines GDLX and GDLXb may be referenced as a data line pair. Column circuitry 118 will be described in more detail in reference to FIGS. 4 and 5.

I/O circuitry 102 is coupled to global data lines GDLX, GDLXb, GDLY, and GDLYb and appropriately routes data from the global data lines to DOUTB and/or DOUTA or from DINB and/or DINA to the global data lines. Within I/O circuitry 102, PA is used to appropriately communicate data between GDLX (and GDLXb) and the port to which the X-circuitry is assigned and between GDLY (and GDLYb) and the port to which the Y-circuitry is assigned. I/O circuitry 102 will be described in more detail in reference to FIGS. 6 and 7.

Figure 2:
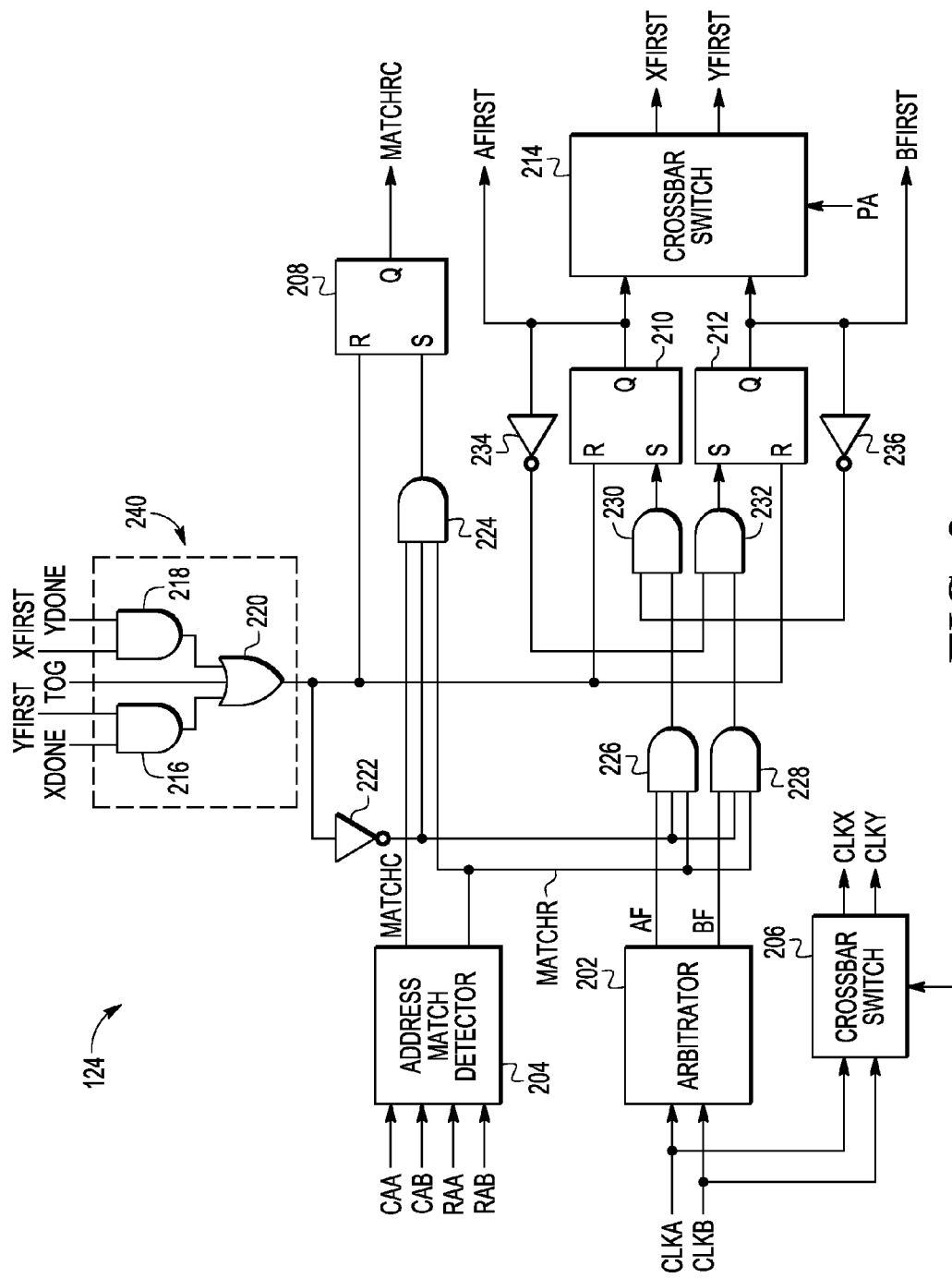
FIG. 2 is a combination logic and block diagram of a portion of an address match detector and clock arbitrator of the multi-port memory of FIG. 1.

FIG. 2 illustrates address match detector and clock arbitrator 124 in more detail. Address match detector and clock arbitrator 124 receives CLKA, CLKB, TOG, XDONE, and YDONE and provides XFIRST, YFIRST, CLKX, CLKY, and MATCHRC. CLKA and CLKB refer to the clocks by which port A and port B, respectively, operate. They may be asynchronous with each other. That is, they may be out of phase and/or have different frequencies. As illustrated in FIG. 2, CLKA and CLKB are both provided to crossbar switch 206, which provides CLKX and CLKY. CLKA and CLKB are provided as either CLKX and CLKY, respectively, or as CLKY and CLK X, respectively, based on PA. For example, as assumed herein, when PA is a logic level one, X-circuitry is assigned to port A and Y-circuitry to port B, therefore, CLKA is provided as CLKX, and CLKB is provided as CLKY. XDONE indicates when an access to array 146 is finished by the X-circuitry and YDONE indicates when an access to array 146 is finished by the Y-circuitry.

Referring back to FIG. 1, CLKX and CLKY are provided to X/Y access timing control 106 which outputs PCCKX, PCCKY, XDONE, and YDONE. In the illustrated embodiment, an access to array 146 is self timed based on rising edges of CLKX and CLKY. That is, all necessary timing signals used to activate the X-circuitry and the Y-circuitry (such as PCCKX, PCCKY, XDONE, and YDONE) are derived from the rising edges of CLKX and CLKY. An access using the X-circuitry (e.g. X word lines and X bit line pairs) is performed using CLKX in which, in response to a rising edge of CLKX, X/Y access timing control 106 asserts XDONE a predetermined amount of time later at which point the use of the X-circuitry for the access initiated by the rising edge of CLKX is completed. Similarly, an access using the Y-circuitry (e.g. Y word lines and Y bit line pairs) is performed using CLKY in which, in response to a rising edge of CLKY, X/Y access timing control 106 asserts YDONE a predetermined amount of time later at which point the use of the Y-circuitry for the access initiated by the rising edge of CLKY is completed. In this manner, XDONE and YDONE provide an indication of when the X-circuitry and the Y-circuitry, respectively, are not busy (and thus available for a next access). Also, X/Y access timing control 106, provides precharge clock PCCKX based on CLKX to precharge X 162 and precharge clock PCCKY based on CLKY to precharge Y 166. As will be described in reference to the timing diagram of FIG. 3, precharge X 162 precharges the bit line pairs of the X-circuitry (e.g. BL0X, BL0Xb, BL1X, BL1Xb) and precharge Y 166 precharges the bit line pairs of the X-circuitry (e.g. BL0Y, BL0Yb, BL1Y, BL1Yb). In the case when each of port A and port B do not result in accessing a same row, precharge X 162 precharges the bit line pairs of the X-circuitry when XDONE is asserted, in preparation for a next access by the X-circuitry, and precharge Y 166 precharges the bit line pairs of the Y-circuitry when YDONE is asserted, in preparation for the next access by the Y-circuitry. However, in the case of a row match, precharging of the X or Y bit line pairs may be delayed, as will be seen in reference to FIG. 3.

Referring back to FIG. 2, address match detector and clock arbitrator 124 includes an address match detector 204 which receives CAA, CAB, RAA, and RAB, and provides MATCHR and MATCHC. If RAA and RAB match, then the row addresses of port A and port B match indicating that a same row is being accessed by the ports and MATCHR is therefore asserted to a logic level one to indicate a row match. If RAA and RAB do not match, then MATCHR is negated (a logic level zero). If CAA and CAB match, then the column address of port A and port B match indicated that a same column is being accessed by the ports and MATCHC is therefore asserted to a logic level one to indicate a column match. If CAA and CAB do not match, then MATCHC is negated (a logic level zero). MATCHR and MATCHC together are used to determine if both a row and column match has occurred. If so, MATCHRC may be asserted to a logic level one. Otherwise, if only a row match or a column match has occurred, MATCHRC is not asserted. Arbitrator 202 receives CLKA and CLKB and provides AF and BF. AF indicates whether CLKA was received first with respect to CLKB and BF indicates whether CLKB was received first with respect to CLKA. For example, upon the occurrence of rising or falling edges of either CLKA or CLKB, arbitrator selectively changes the values of AF and BF when CLKA and CLKB differ in value. For example, upon a rising edge of CLKA, if CLKB is a logic level zero at that point in time, AF is set to a logic level one and BF to a logic level zero indicating that CLKA is first. Similarly, when the falling edge of CLKA occurs and CLKB is a logic level high at that point, BF is set to a logic level one and AF is changed to a logic level zero indicating that CLKB is first. Therefore, in the illustrated embodiment, upon a transition of either CLKA or CLKB, AF is set to a logic level one if CLKA is a logic level one or BF is set to a logic level one if CLKB is a logic level one. This information provides a real time snapshot as to which is first in time, independent of whether or not the access addresses of port A and port B result in any matches. However, when a row match does occur, as indicated by assertion of MATCHR, the values of AF and BF are latched into set-reset (SR) flip flops 210 and 212, respectively, as AFIRST and BFIRST. Therefore, AFIRST and BFIRST indicate which of CLKA or CLKB was first at the time a row match occurred. These values, along with the value of PA, can therefore be used to determine which circuitry, the X-circuitry or the Y-circuitry was being used first at the point at which a row match occurred.

As illustrated in FIG. 2, address match detector and clock arbitrator 124 includes AND gates 224, 226, 228, 230, and 232, and SR flip flops 210 and 212. Each of SR flip flops 210 and 212 includes a reset (R) input, a set (S) input, and a data output (Q). In operation, Q becomes a logic level one upon providing a logic level one to the S input, and Q remains a logic level one until a logic level one is provided to the R input (which resets Q to a logic level zero). AND gate 226 has a first input coupled to receive AF from arbitrator 202, a second input coupled to receive an output of inverter 222, and a third input coupled to receive MATCHR from address match detector 204. AND gate 228 has a first input coupled to receive BF from arbitrator 202, a second input coupled to receive the output of inverter 222, and a third input coupled to receive MATCHR from address match detector 204. AND gate 230 has a first input coupled to receive an output of AND gate 226 and a second input coupled to receive an output of inverter 236. An input of inverter 236 is coupled to Q of SR flip flop 212 and thus receives BFIRST. An output of AND gate 230 is coupled to the S input of SR flip flop 210. AND gate 232 has a first input coupled to receive an output of AND gate 228 and a second input coupled to receive an output of inverter 234. An input of inverter 234 is coupled to Q of SR flip flop 210 and thus receives AFIRST. An output of AND gate 232 is coupled to the S input of SR flip flop 212. The R input of each of SR flip flops 210 and 212 are coupled to the output of reset circuitry 240. Note that when the output of reset circuitry 240 is asserted (i.e. a logic level one), each of AFIRST and BFIRST is reset to a logic level zero. The output of reset circuitry 240 is coupled to an input of inverter 222. Therefore, while the output of reset circuitry 240 is not asserted (i.e. is a logic level zero), the output of inverter 222 is a logic level one and the outputs of AND gates 226 and 228 are determined by their other two inputs.

Therefore, in operation, when a MATCHR occurs and the output of reset circuitry 240 is not asserted (i.e. is a logic level zero), the value of AF is latched into SR flip flop 210 as AFIRST and the value of BF is latched into SR flip flop 212 as BFIRST. For example, if AF is a logic level one and MATCHR is asserted, the second input of AND gate 230 is a logic level one. Also, the previous value of Q of SR flip flop 210 is a logic level zero and thus the output of inverter 236 (and the first input of AND gate 230) is a logic level one, thus latching AFIRST as a logic level one. In this case, the second input of AND gate 232 is a logic level zero (because BF is a logic level zero when AF is a logic level one), and the first input of AND gate 232 is also a logic level zero, thus ensuring that BFIRST remains at a logic level zero. Note that, in this example, AFIRST remains latched at a logic level one until reset by the assertion of the output of reset circuitry 240.

AFIRST and BFIRST are each provided to crossbar switch 214 which, based on PA, provides AFIRST and BFIRST as either XFIRST and YFIRST, respectively, or YFIRST and XFIRST, respectively. Since PA determines which of X or Y circuitry is assigned to each port, XFIRST and YFIRST provide an indication as to which circuitry was in use first upon a row match and thus which circuitry will be "shared" as a result of the row match. For example, if PA is a logic level one, indicating that the X-circuitry is assigned to port A and the Y-circuitry to port B, then if AFIRST is asserted, XFIRST is also asserted by way of crossbar switch 214. Since XFIRST is asserted, the X-circuitry is already in use to perform the access request initiated by the earlier rising edge of CLKA at the time a row match occurs (which results in the assertion of MATCHR due to RAB received from port B). Therefore, as will be described in reference to the timing diagram of FIG. 3, the access request received later by port B which resulted in the row match will be performed by the X-circuitry, even though the PA value of a logic level one indicates that the Y-circuitry is assigned to port B. Similarly, if BFIRST is asserted, YFIRST is also asserted. In this case, the Y-circuitry is already in use to perform the access request initiated by the earlier rising edge of CLKB at the time a row match occurs (which results in the assertion of MATCHR due to RAA received from port A). Therefore, the access request received later by port A which resulted in the row match will be performed by the Y-circuitry, even though the PA value of a logic level one indicates that the X-circuitry is assigned to port A. Note that analogous descriptions would apply in the case in which PA is a logic level zero.

MATCHC, the output of inverter 222, and MATCHR are provided as first, second, and third inputs of AND gate 224. An output of AND gate 224 is coupled to the S input of SR flip flop 208. The output of reset circuitry 240 is provided to the R input of SR flip flop 208 and the Q output of SR flip flop 208 provides MATCHRC. When the output of reset circuitry 240 is asserted (i.e. a logic level one), MATCHRC is reset to a logic level zero. While the output of reset circuitry 240 is not asserted (i.e. is a logic level zero), the output of inverter 222 is a logic level one and the outputs of AND gate 224 is determined by MATCHC and MATCHR. When the output of reset circuitry 240 is not asserted, an asserted value (a logic level one) of MATCHRC is latched in SR flip flop 208 because the output of AND gate 224 goes high. MATCHRC remains a logic level one until reset by the assertion of the output of reset circuitry 240.

Reset circuitry 240 includes AND gates 216 and 218, and OR gate 220. AND gate 216 has a first input coupled to receive XDONE and a second input to receive YFIRST, and AND gate 218 has a first input to receive XFIRST and a second input to receive YDONE. OR gate 220 has a first input coupled to an output of AND gate 216, a second input coupled to receive a toggle indicator (TOG) and a third input coupled to an output of AND gate 218. An output of OR gate 220 provides the output of reset circuitry 240 and is coupled to the input of inverter 222, and the R inputs flip flops 208, 210, and 212. TOG is a signal generated within port assignment control circuitry 148 to indicate when a port assignment toggle should occur, in which each of X-circuitry and Y-circuitry is no longer assigned to its current port assignment, but switched and assigned to the other port. Therefore, note that a reset of the MATCHRC, AFIRST, and BFIRST (and also XFIRST and YFIRST) occurs when YFIRST and XDONE are both asserted, or when TOG is asserted, or when both XFIRST and YDONE are asserted. Under any of these conditions, operation of memory 100 returns to normal until another row match occurs.

Under normal operation, X-circuitry processes access requests from its assigned port and Y-circuitry processes access requests from its assigned port, in which the X-circuitry and Y-circuitry can operate to process requests simultaneously. However, operation changes upon a row match occurring, in which either the X or Y circuitry is shared by both ports. Furthermore, under certain conditions, the port assignments, as indicated by PA, are toggled by PA control circuitry 148. The details of PA control circuitry 148 will be described in further detail below, after the description of column circuitry 118.

Figure 4:
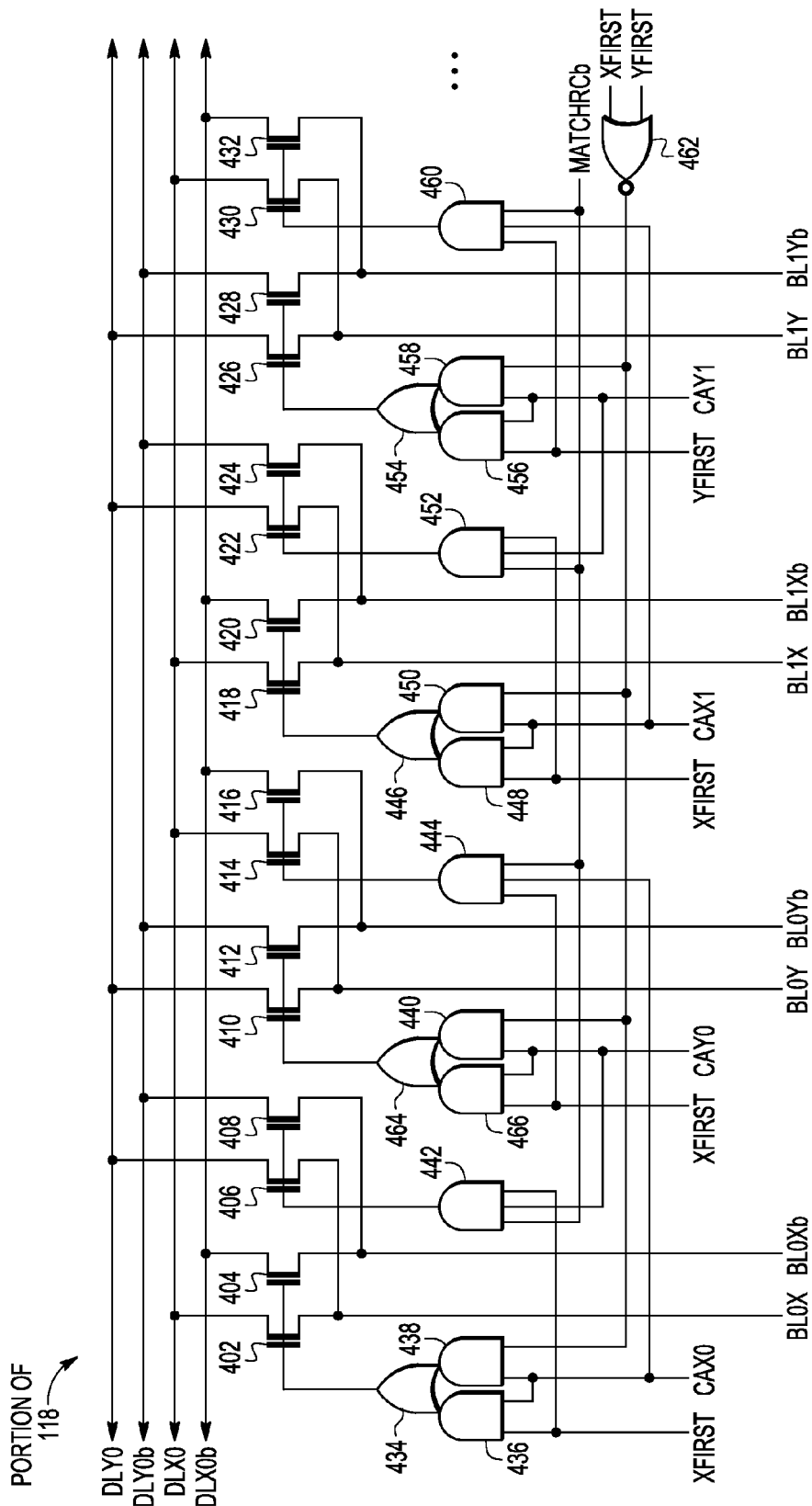
FIG. 4 is a combination logic and circuit diagram of a first portion of the column circuitry of the multi-port memory of FIG. 1 according to an embodiment.
Figure 5:
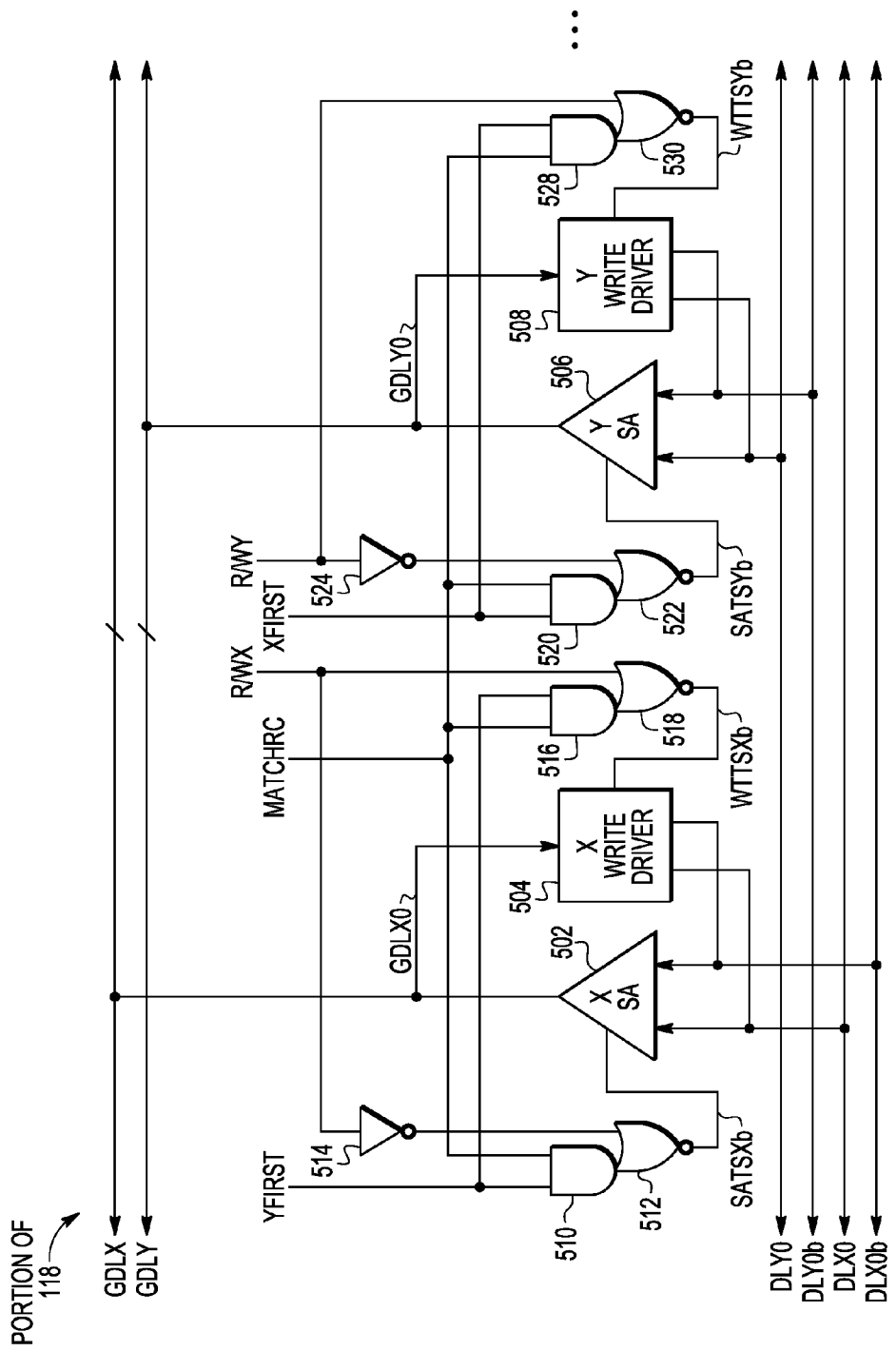
FIG. 5 is a combination logic, circuit, and block diagram of a second portion of the column circuitry of the multi-port memory of FIG. 1 according to an embodiment.

FIGS. 4 and 5 illustrate column circuitry 118 of FIG. 1 in more detail. The portion of column circuitry 118 in FIG. 4 illustrates the coupling between the two illustrated columns of bit cells of array 146 of FIG. 1 and the corresponding data lines, e.g. DLX0, DLX0b, DLY0, and DLY0b. The portion of column circuitry 118 of FIG. 4 illustrates the R/W circuitry coupling the illustrated data lines of FIG. 4 and global data lines GDLX and GDLY. Note that additional circuitry similar to that of FIGS. 4 and 5 would be present to handle the remaining columns of array 146.

Referring first to FIG. 4, column circuitry 118 includes transistors 402, 404, 406, 408, 410, 412, 414, 416, 418, 420, 424, 426, 428, 430, and 432, OR gates 434, 446, 464, and 454, NOR gate 462, and AND gates 436, 438, 442, 466, 440, 444, 448, 450, 452, 456, 458, and 460. Signals CAX0, CAY0, CAX1, and CAY1 result from decoding CAX for signals CAX0 and CAX1 and result from decoding CAY for signals CAY0 and CAY1. These signals may be referred to as an X or Y column address signal or an X or Y column decode signal. Transistor 402 has a first current electrode coupled to true bit line BL0X, a control electrode coupled to an output of OR gate 434, and a second current electrode coupled to a true data line DLX0 of the X-circuitry. Transistor 404 has a first current electrode coupled to complementary bit line BL0Xb, a control electrode coupled to the output of OR gate 434, and a second current electrode coupled to a complementary data line DLX0b of the X-circuitry. Transistor 406 has a first current electrode coupled to true bit line BL0X, a control electrode coupled to an output of AND gate 442, and a second current electrode coupled to a true data line DLY0 of the Y-circuitry. Transistor 408 has a first current electrode coupled to complementary bit line BL0Xb, a control electrode coupled to the output of AND gate 442, and a second current electrode coupled to a complementary data line DLY0b of the Y-circuitry. AND gate 436 has a first input coupled to receive XFIRST and a second input coupled to receive CAX0. AND gate 438 has a first input coupled to receive CAX0 and a second input coupled to an output of NOR gate 462. A first input of OR gate 434 is coupled to the output of AND gate 436 and a second input of OR gate 434 is coupled to the output of AND gate 438. AND gate 442 has a first input coupled to receive MATCHRCb (the complement of MATCHRC), a second input coupled to receive CAY0, and a third input coupled to receive XFIRST. Transistor 410 has a first current electrode coupled to true bit line BL0Y, a control electrode coupled to an output of OR gate 464, and a second current electrode coupled to a true data line DLY0 of the Y-circuitry. Transistor 412 has a first current electrode coupled to complementary bit line BL0Yb, a control electrode coupled to the output of OR gate 464, and a second current electrode coupled to a complementary data line DLY0b of the Y-circuitry. Transistor 414 has a first current electrode coupled to true bit line BL0Y, a control electrode coupled to an output of AND gate 444, and a second current electrode coupled to a true data line DLX0 of the X-circuitry. Transistor 416 has a first current electrode coupled to complementary bit line BL0Yb, a control electrode coupled to the output of AND gate 444, and a second current electrode coupled to a complementary data line DLX0b of the X-circuitry. AND gate 466 has a first input coupled to receive YFIRST and a second input coupled to receive CAY0. AND gate 440 has a first input coupled to receive CAY0 and a second input coupled to the output of NOR gate 462. A first input of OR gate 464 is coupled to the output of AND gate 466 and a second input of OR gate 464 is coupled to the output of AND gate 440. AND gate 444 has a first input coupled to receive YFIRST, a second input coupled to receive CAX0, and a third input coupled to receive MATCHRCb.

Continuing with FIG. 4, transistor 418 has a first current electrode coupled to true bit line BL1X, a control electrode coupled to an output of OR gate 446, and a second current electrode coupled to DLX0 of the X-circuitry. Transistor 420 has a first current electrode coupled to complementary bit line BL1Xb, a control electrode coupled to the output of OR gate 446, and a second current electrode coupled to DLX0b of the X-circuitry. Transistor 422 has a first current electrode coupled to true bit line BL1X, a control electrode coupled to an output of AND gate 452, and a second current electrode coupled to DLY0 of the Y-circuitry. Transistor 424 has a first current electrode coupled to complementary bit line BL1Xb, a control electrode coupled to the output of AND gate 452, and a second current electrode coupled to DLY0b of the Y-circuitry. AND gate 448 has a first input coupled to receive XFIRST and a second input coupled to receive CAX1. AND gate 450 has a first input coupled to receive CAX1 and a second input coupled to the output of NOR gate 462. A first input of OR gate 446 is coupled to the output of AND gate 448 and a second input of OR gate 446 is coupled to the output of AND gate 450. AND gate 452 has a first input coupled to receive MATCHRCb, a second input coupled to receive CAY1, and a third input coupled to receive XFIRST. Transistor 426 has a first current electrode coupled to true bit line BL1Y, a control electrode coupled to an output of OR gate 454, and a second current electrode coupled to DLY0 of the Y-circuitry. Transistor 428 has a first current electrode coupled to BL1Yb, a control electrode coupled to the output of OR gate 454, and a second current electrode coupled to DLY0b of the Y-circuitry. Transistor 430 has a first current electrode coupled to true bit line BL1Y, a control electrode coupled to an output of AND gate 460, and a second current electrode coupled to DLX0 of the X-circuitry. Transistor 432 has a first current electrode coupled to BL1Yb, a control electrode coupled to the output of AND gate 460, and a second current electrode coupled to DLX0b of the X-circuitry. AND gate 456 has a first input coupled to receive YFIRST and a second input coupled to receive CAY1. AND gate 458 has a first input coupled to receive CAY1 and a second input coupled to the output of NOR gate 462. A first input of OR gate 454 is coupled to the output of AND gate 456 and a second input of OR gate 454 is coupled to the output of AND gate 458. AND gate 460 has a first input coupled to receive XFIRST, a second input coupled to receive CAX1, and a third input coupled to receive MATCHRCb. NOR gate 462 has a first input coupled to receive XFIRST and a second input coupled to receive YFIRST.

During normal operation, in which no row match exists, XFIRST and YFIRST are each at a logic level zero and, as a result, the output of NOR gate 462 is a logic level one. AND gates 436 and 448 are deselected by XFIRST (such that its output is a logic level zero), and AND gates 466 and 456 are deselected by YFIRST (such that its output is a logic level zero). NAND gates 438, 440, 450, and 438 receive a logic level one from the output of NOR gate 462 and are therefore activated to provide outputs corresponding to their respective address inputs. Therefore, the decoded column address signals CAX0 and CAX1 determine which of BL0X/BL0Xb or BL1X/BL1Xb are coupled to DLX0/DLX0b by way of AND gates 438 and 450, and the decoded column address signals CAY0 and CAY1 determine which of BL0Y/BL0Yb or BL1Y/BL1Yb are coupled to DLY0/DLY0b by way of AND gates 440 and 458. For example, for the decoded column address signals which are decoded from CAX (e.g. CAX0 and CAX1), only one of the decoded column address signals will be a logic level high. Therefore, assuming CAX0 is a logic level one, CAX1 will be a logic level zero. In this case, the output of OR gate 434 is a logic level one and the output of OR gate 464 is a logic level zero. In this manner, DLX0 is coupled to BL0X and decoupled from BL1X and DLX0b is coupled to BL0Xb and decoupled from BL1Xb. That is, for a given X-circuit column address, CAX, only one of BL0X/BL0Xb or BL1X/BL1Xb is coupled to DLX0/DLX0b. Analogous description applies the Y-circuitry. That is, based on the values of CAY0 and CAY1, only one of BL0Y/BL0Yb or BL1Y/BL1Yb is coupled to DLY0/DLY0b.

When a row match as well as a column match exists, note that both the X-circuitry and Y-circuitry are accessing the same bit cells. When a row and column match exist, one of XFIRST or YFIRST is asserted, and MATCHRCb is a logic level zero (since MATCHRC is a logic level one). In this case, the addressed bit cells will be coupled to only one of the data line pairs (DLX0/DLX0b or DLY0/DLY0b). If XFIRST is asserted, the decoded column address signals CAX0 and CAX1 determine which of BL0X/BL0Xb or BL1X/BL1Xb are coupled to DLX0/DLX0b by way of AND gates 436 and 448. In this case, no bit lines are coupled to DLY0/DLY0b (due to YFIRST being a logic level zero, MATCHRCb being a logic level zero, and XFIRST NOR YFIRST being a logic level zero, thus ensuring that the outputs of OR gates 464 and 454, and AND gates 442 and 452 are logic level zeros). However, if YFIRST is asserted, the decoded column address signals CAW) and CAY1 determine which of BL0Y/BL0Yb or BL1Y/BL1Yb are coupled to DLY0/DLY0b by way of AND gates 466 and 456. In this case, no bit lines are coupled to DLX0/DLX0b (due to XFIRST being a logic level zero, MATCHRCb being a logic level one, and XFIRST NOR YFIRST being a logic level zero, thus ensuring that the outputs of OR gates 434 and 446 and AND gates 444 and 460 are logic level zeros).

When a row match exists, but no column match exists, note that one of XFIRST or YFIRST is asserted (as was described above in reference to address match detector and clock arbitrator 124 in FIGS. 1 and 2). Also, in this case, MATCHRCb is a logic level one (since MATCHRC is a logic level zero). In this case, the later received matching row address (corresponding to one of RAX or RAY) will share the bit lines and word lines in use by the earlier received matching row address. For example, if XFIRST is asserted, then the X-circuitry was processing an access request with RAX on X-circuitry when an access request with RAY for processing by the Y-circuitry resulted in a match with RAX. In this case, the selected word line of the X-circuitry can be activated by row decoder X 130 (in which row decoder Y 132 will be disabled by XFIRST since RAX and RAY have the same value, thus resulting in none of the word lines of the Y-circuitry being activated). Furthermore, the access request corresponding to RAY is processed using the addressed bit lines of the X-circuitry by coupling the X-circuitry bit lines of the addressed bit cells to the data lines (DLY0 and DLY0b) of the Y-circuitry. In addition, since the access request corresponding to RAY is being processed by the X-circuitry, the addressed bit lines of the Y-circuitry are decoupled from the data lines (DLY0 and DLY0b) of the Y-circuitry. Note that port A can be assigned to either X-circuitry or Y-circuitry and port B to the other of the X-circuitry or Y-circuitry, based on PA. That is, assertion of XFIRST may correspond to either the assertion of AFIRST or BFIRST, based on PA. In the case where PA is a logic level one and thus port A is assigned to the X-circuitry, if XFIRST is asserted, then the X-circuitry was processing an access request from port A when an access request arrived at port B having a row address which matches the row address of the access request from port A. Similarly, in the case where PA is a logic level zero and thus port B is assigned to the X-circuitry, if XFIRST is asserted, then the X-circuitry was processing an access request from port B when an access request arrived at port A having a row address which matches the row address of the access request from port B. Therefore, operation of the portion of column decoder 118 illustrated in FIG. 4 operates the same regardless of the port assignment (i.e. regardless of the value of PA).

In order to better describe operation of FIG. 4, an example will be described in which it is assumed that XFIRST is asserted, and that when XFIRST is asserted, MATCHRC is a logic level zero and MATCHRCb is a logic level one (indicating no column match), CAX0 is a logic level zero, and CAY0 is a logic level one. It is assumed for this example that CAY0 is a logic level one before and after XFIRST is asserted. Note that since there is no column match, CAX0 and CAY0 cannot have the same value. Since CAX0 is a logic level zero, CAX1 must be a logic level one, and since CAY0 is a logic level one, CAY1 is a logic level zero. Therefore, just prior to XFIRST being asserted (when both XFIRST and YFIRST are logic level zeros), BL1X and BL1Xb are coupled by transistors 418 and 420 to DLX0 and DLX0b since the output of AND gate 450 is a logic level one, and BLX1 and BLX1b are maintained decoupled from DLY0 and DLY0b because the output of AND gate 452 is a logic level zero. Also, BL0Y and BL0Yb are coupled to DLY0 and DLY0b by transistors 410 and 412 since the output of AND gate 440 is a logic level one, and BL0Y and BL0Yb are maintained decoupled from DLX0 and DLX0b because the output of AND gate 444 is a logic level zero. Because CAX0 is a logic level zero, BL0X and BL0Xb are decoupled from DLX0 and DLX0b, and because CAY1 is a logic level zero, BL1Y and BL1Yb are decoupled from DLY0 and DLY0b. Therefore, both data line pairs DLX0 and DLX0b and data line pair DLY0 and DLY0b are coupled to the corresponding selected X and Y bit line pairs prior to assertion of XFIRST. However, when XFIRST is asserted, the addressed bit cells use the bit lines of the X-circuitry to communicate with the data lines of the Y-circuitry. In the current example, since CAX0 is a logic level zero and CAW) is a logic level one, the output of AND gate 442 is a logic level one, thus coupling BL0X and BL0Xb to DLY0 and DLY0b by way of transistors 406 and 408. Also, the word line addressed by RAX (which is the same address as RAY) is activated by row decoder X 130. Therefore, the bit cells addressed by CAY and RAY (which resulted in a row match) use the word line and bit lines of the X-circuitry to communicate with the data lines of the Y-circuitry. Also, since XFIRST is asserted, BL0Y and BL0Yb are decoupled from DLY0 and DLY0b (due to the output of AND gate 440 being a logic level zero and the output of AND gate 466 being a logic level zero). Therefore, in this example in which the Y-circuitry is using or "sharing" the word line and bit lines of the X-circuitry, note that the bit lines and word line of the Y-circuitry are deselected. Therefore, both ports A and B are using the same X-circuitry to address their bit cells. As will be described below in reference to FIG. 3, though, the port currently assigned to the X-circuitry by PA, whose word lines and bit lines are being used by the Y-circuitry, may receive an access request to an address which no longer results in a row match with RAY. In this case, that port, rather than waiting for the X-circuitry to complete the access being performed for the Y-circuitry, can be reassigned by PA control circuitry 148 to the currently unused Y-circuitry. Furthermore, the port currently assigned to the unused Y-circuitry is reassigned to the X-circuitry (which is the circuitry currently being used to process its access request). This results in a swap or toggle of port assignments (in which PA toggles in value).

Referring back to PA control circuitry 148 of FIG. 1, PA control circuitry 148 provides PA and also determines when to toggle the value of PA, which results in a toggle of port assignments. PA control circuitry 148 includes inverters 110 and 112, AND gates 114 and 116, an OR gate 118, and a toggle (T) flip flop 108. T flip flop 108 has a clock input, and provides a data output, Q. When a rising clock edge is received at the clock input, the value of Q is toggled. That is, if output Q was a logic level one, then upon a rising edge of the clock input, it is transitioned to a logic level zero, and if it was a logic level zero, then upon a rising edge of the clock input, it is transitioned to a logic level one. Inverter 110 has an input coupled to receive YDONE, and inverter 112 has an input coupled to receive XDONE. AND gate 114 has a first input coupled to receive CLKX, a second input coupled to receive XFIRST from address match detector and clock arbitrator 124, and a third input coupled to an output of inverter 110. AND gate 116 has a first input coupled to receive YFIRST from address match detector and clock arbitrator 124, a second input coupled to an output of inverter 112, and a third input coupled to receive CLKY. OR gate 118 has a first input coupled to an output of AND gate 114, a second input coupled to an output of AND gate 116, and an output coupled to the clock input of T flip flop 108. The output of OR gate 118 also provides the toggle signal (TOG) to address match detector and clock arbitrator 124.

In operation, when XFIRST is asserted, indicating that Y is using the X-circuitry to perform its access, then once a rising edge of CLKX is received and the access for Y (which is using the X-circuitry) has not yet finished, TOG is asserted such that PA is toggled to switch the port assignments. Similarly, when YFIRST is asserted, indicating that X is using the Y-circuitry to perform its access, then once a rising edge of CLKY is received and the access for X (which is using the Y-circuitry) has not yet finished, TOG is also asserted such that PA is toggled to switch port assignments. That is, note that if the X-circuitry is being shared with the Y-circuitry, and the Y-circuitry is idle, PA may be toggled in the case where a next rising edge of CLKX is received but the Y access using the X-circuitry is not yet done. In this manner, by toggling the port assignments, even though the Y access using the X-circuitry has not finished, the port assignments are switched such that the port which was assigned to the X-circuitry and thus whose accesses were previously being performed by the X-circuitry can now be assigned to the Y-circuitry, which is currently idle due to the sharing in response to the row match. The new port assignment remains as toggled until a future timing condition, similar to the example above, results in another toggle. This will be further described in reference to FIG. 3.

Figure 3:
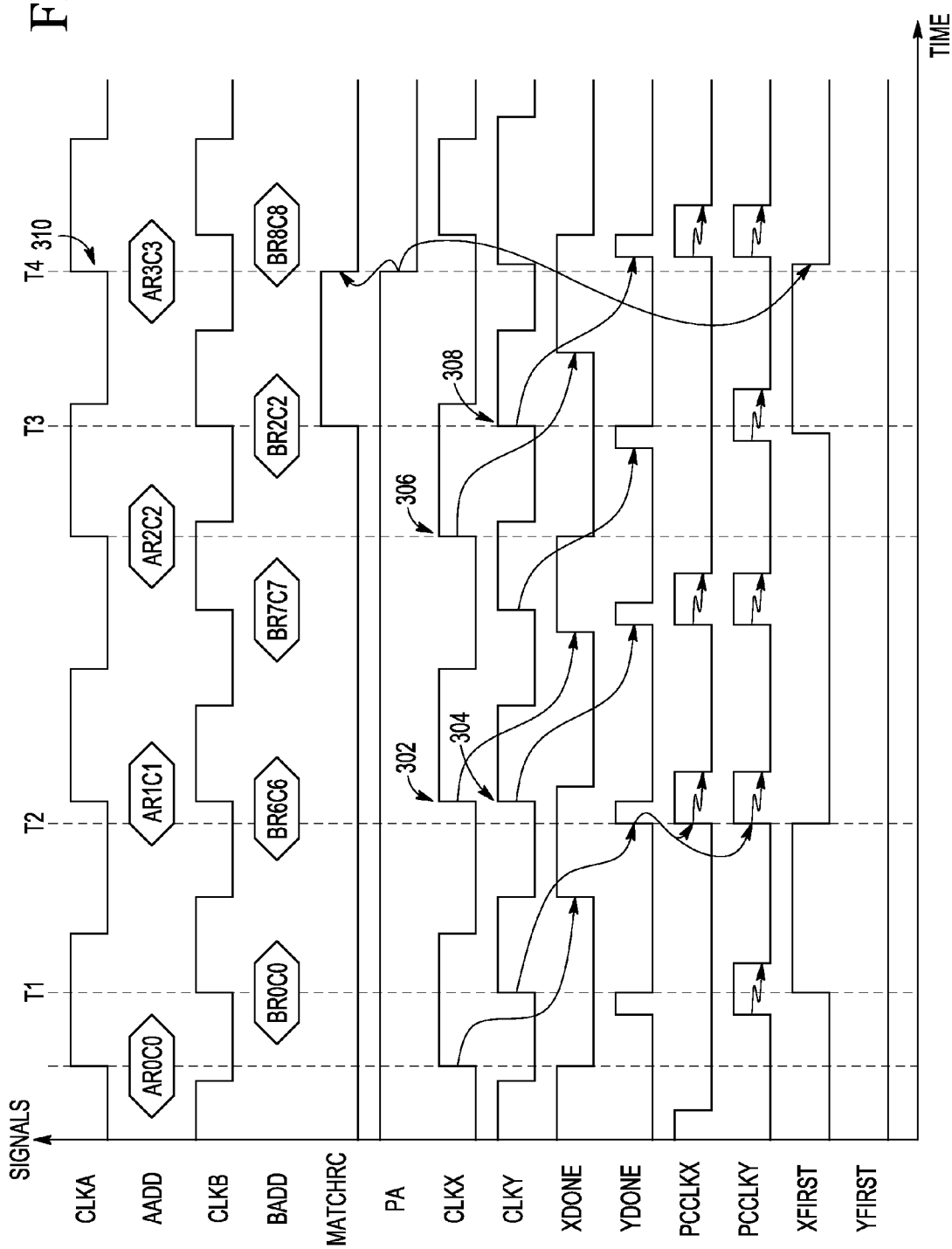
FIG. 3 is a timing diagram illustrating signals within the multi-port memory of FIG. 1 in accordance with an exemplary operation of the multi-port memory of FIG. 1.

FIG. 3 illustrates, in timing diagram form, an example of a port assignment toggle in accordance with one example which includes waveforms of many of the signals described above. The timing diagram of FIG. 3 includes CLKA, a port A access address (AADD), CLKB, a port B access address (BADD), MATCHRC, PA, CLKX, CLKY, XDONE, YDONE, PCCLKX, PCCLKY, XFIRST, and YFIRST. Note that CLKA and CLKB have different frequencies and are out of phase with each other. A series of access addresses (AR0C0, AR1C1, AR2C2, and AR3C3) are received at port A at the rising edge of each clock cycle of CLKA. A series of access addresses (BR0C5, BR6C6, BR7C7, BR2C2, and BR8C8) are received at port B at the rising edge of each clock cycle of CLKB. The first letter of the access address nomenclature indicates whether the access address if from port A or ort B. The "R" portion of the access address nomenclature refers to the row address of the access address, and the "C" portion in the access address nomenclature refers to the column address of the access address. Initially, PA is a logic level one, which in the illustrated embodiment, indicates that port A is assigned to the X-circuitry and port B to the Y-circuitry. Therefore, CLKA is provided as CLKX, and CLKB as CLKY, as was described above in reference to address match detector and clock arbitrator 124.

Upon the first illustrated rising edge of CLKX, the access request AR0C0 is accepted for processing by the X-circuitry of memory 100. Based on the rising edge of CLKX, self timed X/Y access timing control 106 asserts XDONE, which indicates when the X-circuitry is done processing AR0C0. Note that in the illustrated embodiment, memory 100 is capable of processing an access request received at port A within one clock cycle of CLKA, and processing an access request received at port B within one clock cycle of CLKB. Also, note that prior to the first illustrated rising edge of CLKX, the bit lines of the X-circuitry have been precharged by precharge X 162, and prior to the first illustrated rising edge of CLKY, the bit lines of the Y-circuitry have been precharged by precharge Y 166.

At time T1 (which corresponds to a rising edge of CLKB and thus CLKY), the access request BR0C5 is accepted for processing by the Y-circuitry of memory 100. The row address of this access request, R0, matches the row address of the previous access request on port A, which is also R0. Therefore, a row match occurs at the rising edge of CLKY. However, no column match occurs because C0 and C5 do not match. XFIRST is asserted because the rising edge of CLKX which commenced processing of AR0C0 occurred prior to the rising edge of CLKY which commenced processing of BR0C5. Also, MATCHRC remains negated at a logic level zero. Note that since a row match occurs, but not a column match, the Y-circuitry will use the addressed bit lines and word line of the X-circuitry to process the access request. That is, as described above in reference to FIG. 4, the column address, C5, will be used to determine which of the bit line pairs of the X-circuitry will be coupled to the data lines of the Y-circuitry. Also, the bit lines and word lines of the Y-circuitry are now idle because they are not being used to access BR0C5 even though port B is assigned to the Y-circuitry. Based on self timing, other portions of the Y-circuitry, such as sensing or writing, may continue to be provided timing signals (not shown) from X/Y access timing control 106 prior to the assertion of YDONE at the end of the Y access. In the embodiment of FIG. 3, YDONE is asserted at time T2.

In a non row match situation, X/Y access timing control 106 asserts PCCLKX based on XDONE and asserts PCCLY based on YDONE. That is, in a non row match situation, once the current access is done by the corresponding circuitry, the corresponding bit lines can be precharged. However, in a row match situation, in which bit lines are being shared, the precharge may need to be delayed until the sharing circuitry completes its access. For example, referring to FIG. 3, since the Y-circuitry is using the addressed word line and bit lines of the X-circuitry to process BR0C5, the bit lines of the X-circuitry cannot be precharged until both XDONE and YDONE are asserted, even though XDONE was asserted prior to T2. Therefore, both PCCLKX and PCCLKY are asserted at time T2 in response to YDONE (since BR0C5 is actually being processed by the bit lines and word lines of the X-circuitry). Even though the Y bit lines were not used, the Y bit lines are precharged to restore any drift in the voltage level during the time they were inactive. Also, when XFIRST and YDONE are both asserted, occurring at time T2, XFIRST is reset back to a logic level zero. Since XFIRST is reset to a logic level zero prior to the next rising edge of CLKX, no port swap is needed. That is, the sharing the word line and bit lies of the X-circuitry by the Y-circuitry ended prior to the X-circuitry having to access a different row. Upon the next rising 302 of CLKX (also corresponding to the next rising edge of CLKA), XFIRST is back to a logic level zero (and YFIRST remains a logic level zero), therefore, TOG is not asserted, and PA remains a logic level high.

At rising edge 302 of CLKX, since no toggle occurred, port A remains assigned to the X-circuitry and port B remains assigned to the Y-circuitry. At rising edge 302, access address AR1C1 is received and processed by the X-circuitry, and at the subsequent rising edge 304 of CLKY (also corresponding to the subsequent rising edge of CLKB), BR6C6 is received and processed by the Y-circuitry. In this case, no row match occurs, so each access request is processed by its assigned circuitry without sharing. That is, the bit lines and word line of the X-circuitry addressed by AR1C1 is used to process this request, and the bit lines and word line of the Y-circuitry addressed by BR6C6 is used to process this request. XDONE is asserted in response to rising edge 302, as is PCCLKX. YDONE is asserted in response to rising edge 304, as is PCCLKY. Note that PCCLKX does not depend on YDONE in this case, and PCCLKY does not depend on XDONE since a row match did not occur.

At a subsequent rising edge 306 of CLKX (also corresponding to the subsequent rising edge of CLKA), access address AR2C2 is received for processing by the X-circuitry. At a subsequent rising edge 308 of CLKY (also corresponding to the subsequent rising edge of CLKB), which occurs at time T3, access address BR2C2 is received for processing by the Y-circuitry. In this case, both a row match and column match occur, therefore MATCHRC is asserted. Also, XFIRST is asserted at T3 since AR2C2 was received by port A prior to BR2C2 being received by port B (and PA is a logic level one). Since XFIRST is asserted, the addressed bit lines and word line of the X-circuitry is being used to perform the access to both AR2C2 and BR2C2 (since they address the same bit cell) while the bit lines and word lines of the Y-circuitry are unused. Therefore, no precharging of the bit lines of the X or Y circuitry can be performed until the access to the same bit cell is done (until both XDONE and YDONE are asserted). However, at the subsequent rising edge 310 of CLKA at time T4, even though port A is still assigned to the X-circuitry, the X-circuitry cannot yet begin to process AR3C3 (which is at a different row than currently being accessed by the X-circuitry) because, at time T4, YDONE has not yet been asserted. Note that although both AR2C2 and BR2C2 are accessing the same bit cell, the processing of BR2C2 began later and will be completed later in time as compared to AR2C2 since BR2C2 is being processed in accordance with CLKY and not CLKX. Therefore, the X-circuitry must wait for YDONE to be asserted before processing a new access request to a different row (not R2 anymore), such as AR3C3. In this case, upon occurrence of rising edge 310 of CLKA, which is still being provided as CLKX due to PA being a logic level one, since XFIRST is a logic level high (indicating that the X0-circuitry is being used to process a request assigned to the Y-circuitry) and YDONE has not yet been asserted, PA port assignment 148 asserts TOG to toggle PA so that PA, just after time T4, becomes a logic level low. At this point, port A is now assigned to the Y-circuitry and port B to the X-circuitry. This toggle also resets XFIRST and MATCHRC back to a logic level zero (as can be seen in the logic of FIG. 2).

Therefore, due to the port assignment toggle, AR3C3 is now processed by the Y-circuitry which was not being used by port B when port B was assigned to it. Furthermore, since the Y-circuitry is unused at time T4, AR3C3 can immediately be processed. In this manner, the access request on port A can still be processed within a clock cycle of CLKA, without needing to incur any wait states, even though its circuitry was "shared" by the other port. Also, since port B is now assigned to the X-circuitry, the subsequently received access request by port B, corresponding to BR8C8, is processed by the X-circuitry. Therefore, note that in the first situation (with AR0C0 and BR0C5) in which XFIRST was asserted, the "sharing" completed early enough before a port assignment toggle was needed, and thus the next accesses are processed by the same circuitry assigned to the port before the "sharing" occurred. However, in the second situation at time T4, the port assigned to the X-circuitry changed such that, while the X-circuitry was assigned to process the requests from port A just prior to assertion of XFIRST, after the transition of PA at time T4, the Y-circuitry is assigned to process the requests from port A and the X-circuitry is assigned to process the requests from port B. Because, at the time PA switched, the port B access request was already being processed using the X-circuitry and because the timing provided by X/Y access timing control 106 is self timed, the port B access request continues to completion without interruption in a single clock cycle of CLKB.

Referring now to FIG. 5, FIG. 5 illustrates a second portion of column circuitry 118 which includes a portion of the R/W circuitry of column circuitry 118 coupling the illustrated data lines of FIG. 4 and global data lines GDLX and GDLY. FIG. 5 includes an X sense amplifier (SA) 502 and an X write driver 504 which both correspond to the X-circuitry, and a Y SA 506 and a Y write driver 508 which both correspond to the Y-circuitry. FIG. 5 also includes inverters 514 and 524, AND gates 510, 516, 520, and 528, and NOR gates 512, 518, 522, and 530. A first sensing input of X SA 502 is coupled to DLX0, a second sensing input of X SA 502 is coupled to DLX0b, a control input of X SA 502 is coupled to an output of NOR gate 512 to receive an active low SA tri-state enable signal (SATSXb), and an output of X SA 502 is coupled to the GDLX bus. A first output of X write driver 504 is coupled to DLX0, a second output of X write driver 504 is coupled to DLX0b, and a control input of X write driver 504 is coupled to an output of NOR gate 518 to receive an active low write driver tri-state enable signal (WTTSXb). The input of X write driver 504 is coupled to global data line GDLX. A first input of AND gate 510 is coupled to receive YFIRST, a second input of AND gate 510 is coupled to receive MATCHRC. A first input of NOR gate 512 is coupled to an output of AND gate 510, and a second input of NOR gate 512 is coupled to an output of inverter 514. An input of inverter 514 is coupled to receive R/WX. A first input of AND gate 516 is coupled to receive MATCHRC, a second input of AND gate 516 is coupled to receive YFIRST. A first input of NOR gate 518 is coupled to an output of AND gate 516, and a second input of NOR gate 518 is coupled to receive R/WX. A first sensing input of Y SA 506 is coupled to DLY0, a second sensing input of Y SA 506 is coupled to DLY0b, a control input of Y SA 506 is coupled to an output of NOR gate 522 to receive an active low SA tri-state enable signal (SATSYb), and an output of Y SA 506 is coupled to the GDLY bus. A first output of Y write driver 508 is coupled to DLY0, a second output of Y write driver 508 is coupled to DLY0b, and a control input of Y write driver 508 is coupled to an output of NOR gate 530 to receive an active low write driver tri-state enable signal (WTTSYb). The input of Y write driver 508 is coupled to global data line GDLY. A first input of AND gate 520 is coupled to receive XFIRST, a second input of AND gate 520 is coupled to receive MATCHRC. A first input of NOR gate 522 is coupled to an output of AND gate 520, and a second input of NOR gate 522 is coupled to an output of inverter 524. An input of inverter 524 is coupled to receive R/WY. A first input of AND gate 528 is coupled to receive MATCHRC, a second input of AND gate 528 is coupled to receive XFIRST. A first input of NOR gate 530 is coupled to an output of AND gate 528, and a second input of NOR gate 530 is coupled to receive R/WY. Each of R/WX and R/WY may be provided with the access requests received by the port assigned to the X-circuitry and the port assigned to the Y-circuitry, respectively, as control signals provided with the access requests. The R/W signal indicates whether the corresponding access request is a read or a write. In the illustrated embodiment, if the R/W signal is asserted (e.g. a logic level one), then the access request is a read, else the access request is a write. The active low tri state enable signals (such as SATSXb, WTTSXb, SATSYb, and WTTSYb) disable (i.e. deactivate) the corresponding SA or write driver by placing the corresponding SA or write driver in tri-state mode when the signal is a logic level low or zero, and enable (i.e. activate) the corresponding SA or write driver when the signal is a logic level high or one. R/WX and R/WY will be further discussed in reference to FIG. 6.

In operation, when there is no row match, XFIRST and YFIRST are each logic level zeros and MATCHRC is also a logic level zero. Therefore, the outputs of AND gates 510, 516, 520, and 528 are all logic level zeros. In this case, R/WX controls which of X SA 514 or X write driver 504 is enabled, and R/WY controls which of Y SA 506 or T write driver 508 is enabled. For example, for a read, R/WX is a logic level one causing inverter 514 to output a logic level zero, and therefore, the output of NOR gate 512 is a logic level one, thus enabling X SA 502, and the output of NOR gate 518 is a logic level zero, thus disabling X write driver 504. When X SA 502 is enabled, X SA 502 senses DLX0/DLX0b and provides a data value for GDLX0 to the global data line GDLX. For a write, R/WX is a logic level zero, and therefore, the output of NOR gate 512 is a logic level zero, thus disabling X SA 502 and the output of NOR gate 518 is a logic level one, thus enabling X write driver 504. When X write driver 504 is enabled, X write driver 504 writes data from the global data line GDLX to DLX0/DLX0b. Note that analogous descriptions apply to R/WY, Y SA 506 and Y write driver 508.

Similar operation occurs when there is a row match (in which XFIRST or YFIRST is a logic level one) but there is no column match (and thus MATCHRC is a logic level zero). Again, due to MATCHRC being a logic level zero, the outputs of AND gates 510, 516, 520, and 528 are all logic level zeros. In this case, as in the case in which there is no row match described above, R/WX controls which of X SA 514 or X write driver 504 is enabled, and R/WY controls which of Y SA 506 or T write driver 508 is enabled.

However, when there is a row match and a column match, only one of the X portion of the R/W circuitry of FIG. 5 or the Y portion of the R/W circuitry of FIG. 5 (depending on which of the X-circuitry or the Y-circuitry was in use first) is used while the other of the X or Y portion of FIG. 5 is inhibited. For example, if XFIRST is a logic level one, then the X-circuitry was in use first at the time the row match occurred, as was described above, and YFIRST is a logic level zero. In this case, the output of AND gates 510 and 516 are a logic level zero, and the R/WX controls the enabling or disabling of X SA 502 and X write driver 504. However, because XFIRST is a logic level one and MATCHRC is a logic level one, the outputs of each of AND gate 520 and 528 is a logic level one. Therefore, the output of NOR gates 522 and 530 are logic level zeros, regardless of the value of R/WY. Each of Y SA 506 and Y write driver 508 are therefore inhibited when there is a row and column match and XFIRST is a logic level one. Similarly, if YFIRST is a logic level one, then the Y-circuitry was in use first at the time the row match occurred, as was described above, and XFIRST is a logic level zero. In this case, the output of AND gates 520 and 528 are a logic level zero, and the R/WY controls the enabling or disabling of Y SA 506 and Y write driver 508. However, because YFIRST is a logic level one and MATCHRC is a logic level one, the outputs of each of AND gate 510 and 516 is a logic level one. Therefore, the output of NOR gates 512 and 518 are logic level zeros, regardless of the value of R/WX. Each of X SA 502 and X write driver 504 are therefore inhibited when there is a row and column match and YFIRST is a logic level one.

Figure 6:
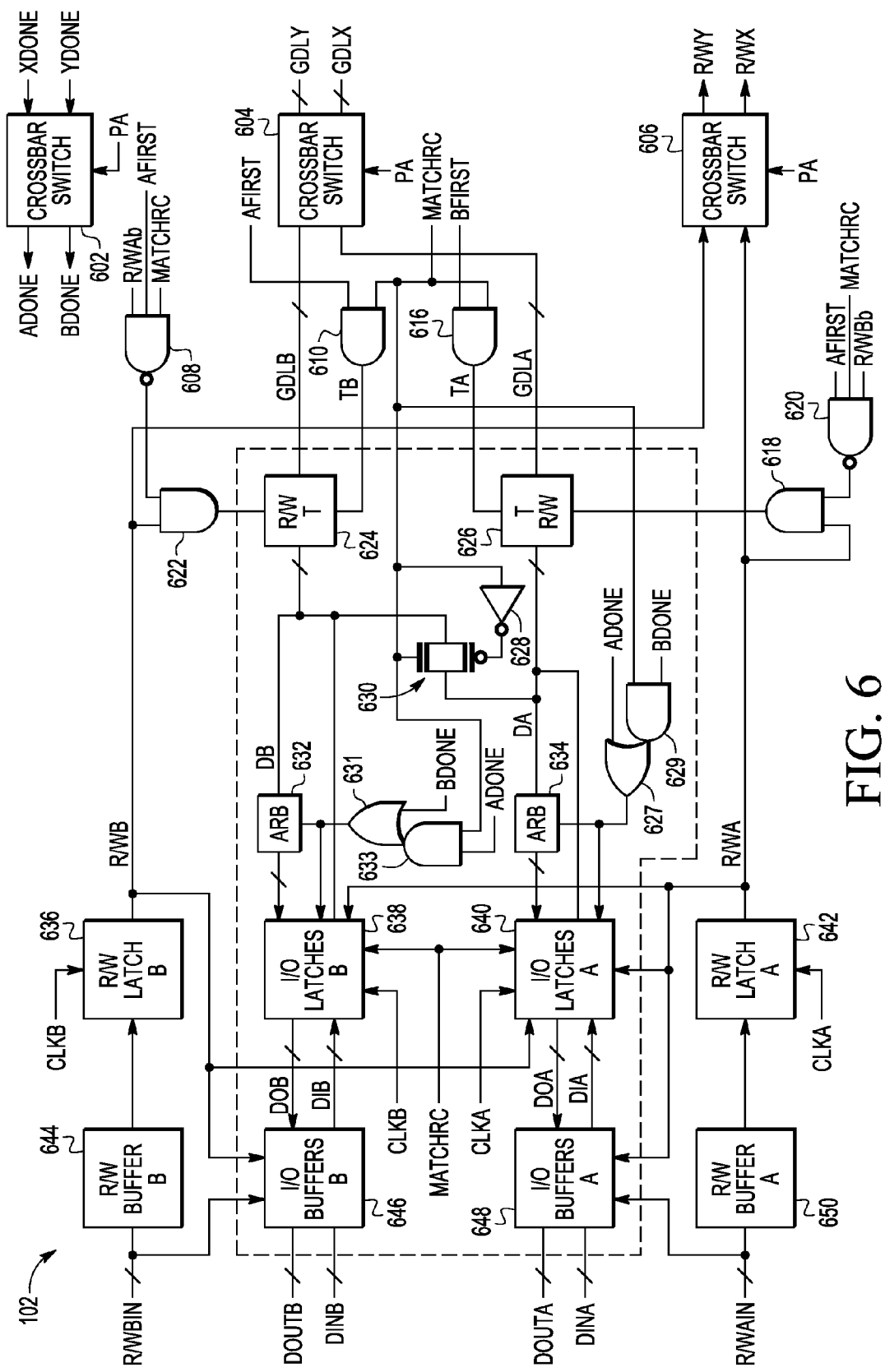
FIG. 6 is a combination logic, circuit, and block diagram of the I/O circuitry of the multi-port memory of FIG. 1 according to an embodiment.

FIG. 6 illustrates I/O circuitry 102 of FIG. 1 in greater detail. Within I/O circuitry 102, the X-circuitry communicates with its assigned port based on PA and the Y-circuitry communicates with its assigned port based on PA. Illustrated in FIG. 6 are crossbar switches 602, 604, and 606, NAND gates 620 and 608, AND gates 622, 629, 633, 610, 618, and 616, OR gates 627 and 631, transmission circuits 624 and 624, a transmission gate 630, an inverter 628, arbitrators (ARBs) 632 and 634, a R/W latch B 636, a R/W buffer B 644, I/O buffers B 646, I/O latches B 638, I/O buffers A 648, I/O latches A 640, R/W buffer A 650, and R/W latch A 642.

R/W buffer B 644 receives an R/W input control signal corresponding to port B (referred to as R/WBIN), which is also provided to I/O buffers B 646. An output of R/W buffer B 644 is coupled to an input of R/W latch B 636, an output of which is coupled to provide R/WB (corresponding to a buffered and latched version of R/WBIN) to I/O buffers B 646 and I/O latches B 638. R/W latch B 636 also receives CLKB. I/O buffers B 646 receive input data by port B (referred to as DINB) which may correspond to write data provided with a write access request on port B. I/O buffers B 646 also provide output data external to memory 100 from port B (referred to as DOUTB) which may correspond to read data provided in response to a read access request on port B. I/O buffers B 646 provide a buffered version of DINB to I/O latches B 638 as DIB, and receive latched data DOB from I/O latches B 638. I/O latches B 638 is also coupled to an output of ARB 632, an output of OR gate 631, a first data terminal of transmission gate 630, CLKB, MATCHRC, and R/WA (provided from R/W latch A 642, to be described below). ARB 632 is coupled to the first terminal of transmission gate 630, to a first terminal of transmission circuitry 624, and is coupled to an output of OR gate 631. OR gate 631 has a first input coupled to an output of AND gate 633 and a second input coupled to receive BDONE. AND gate 633 has a first input coupled to receive ADONE and a second input coupled to receive MATCHRC. Note that the output of OR gate 631 provides an enable signal to control inputs of ARB 632 and I/O latches B 638.

R/W buffer A 650 receives an R/W input control signal corresponding to port A (referred to as R/WAIN), which is also provided to I/O buffers A 648. An output of R/W buffer A 650 is coupled to an input of R/W latch A 642, an output of which is coupled to provide R/WA (corresponding to a buffered and latched version of R/WAIN) to I/O buffers A 648, I/O latches A 640, and to I/O latches B 638. R/W latch A 642 also receives CLKA. I/O buffers A 648 receive input data by port A (referred to as DINA) which may correspond to write data provided with a write access request on port A. I/O buffers A 648 also provide output data external to memory 100 from port A (referred to as DOUTA) which may correspond to read data provided in response to a read access request on port A. I/O buffers A 648 provide a buffered version of DINA to I/O latches A 640 as DIA, and receive latched data DOA from I/O latches A 640. I/O latches A 640 is also coupled to an output of ARB 634, an output of OR gate 627, a second data terminal of transmission gate 630, CLKBA, and MATCHRC. ARB 634 is coupled to the second terminal of transmission gate 630, to a first terminal of transmission circuitry 626, and is coupled to an output of OR gate 627. OR gate 627 has a first input coupled to receive ADONE and a second input coupled an output of AND gate 629. AND gate 629 has a first input coupled to receive BDONE and a second input coupled to receive MATCHRC. Note that the output of OR gate 627 provides an enable signal to control inputs of ARB 634 and I/O latches A 640.

A second terminal of transmission circuitry 624 is coupled to an output of AND gate 622, a third terminal of transmission circuitry 624 is coupled via the GDLB bus to crossbar switch 604, and a fourth terminal of transmission circuitry 624 is coupled to an output of AND gate 610. AND gate 622 has a first input coupled to receive R/WB and a second input coupled to an output of NAND gate 608. NAND gate 608 has a first input coupled to receive the complement of R/WA (R/WAb), a second input coupled to receive BFIRST, and a third input coupled to receive MATCHRC. AND gate 610 provides TB to transmission circuitry 624, and has a first input coupled to receive AFIRST and a second input coupled to receive MATCHRC. A control input of transmission gate 630 is coupled to receive MATCHRC, and an inverse control input of transmission gate 630 is coupled to an output of inverter 628, whose input is coupled to receive MATCHRC. A second terminal of transmission circuitry 626 is coupled to an output of AND gate 618, a third terminal of transmission circuitry 626 is coupled via the GDLA bus to crossbar switch 604, and a fourth terminal of transmission circuitry 626 is coupled to an output of AND gate 616. AND gate 618 has a first input coupled to receive R/WA and a second input coupled to an output of NAND gate 620. NAND gate 620 has a first input coupled to receive the complement of R/WB (R/WBb), a second input coupled to receive MATCHRC, and a third input coupled to receive AFIRST. AND gate 616 provides TA to transmission circuitry 626, and has a first input coupled to receive BFIRST and a second input coupled to receive MATCHRC.

Crossbar switch 602 has a control input coupled to receive PA and, based on PA, routes XDONE and YDONE to ADONE and BDONE, respectively, or to BDONE and ADONE, respectively. For example, if PA is a logic level one, then XDONE is routed to ADONE and YDONE to BDONE since the X-circuitry is assigned to port A and the Y-circuitry to port B. Crossbar switch 604 has a control input to receive PA, and, based on PA, routes the GDLX bus and the GDLY bus to the GDLA bus and the GDLB bus, respectively, or to the GDLB bus and GLDA bus, respectively. For example, if PA is a logic level one, then the GDLX bus is routed to the GDLA bus and the GDLY bus to the GDLB bus since the X-circuitry is assigned to port A and the Y-circuitry to port B. Crossbar switch 606 has a control input to receive PA, and, based on PA, routes R/WA and R/WB to R/WX and R/WY, respectively, or to R/WY and R/WX, respectively. For example, if PA is a logic level one, then R/WA is routed to R/WX and R/WB to R/WY since the X-circuitry is assigned to port A and the Y-circuitry to port B.

Figure 7:
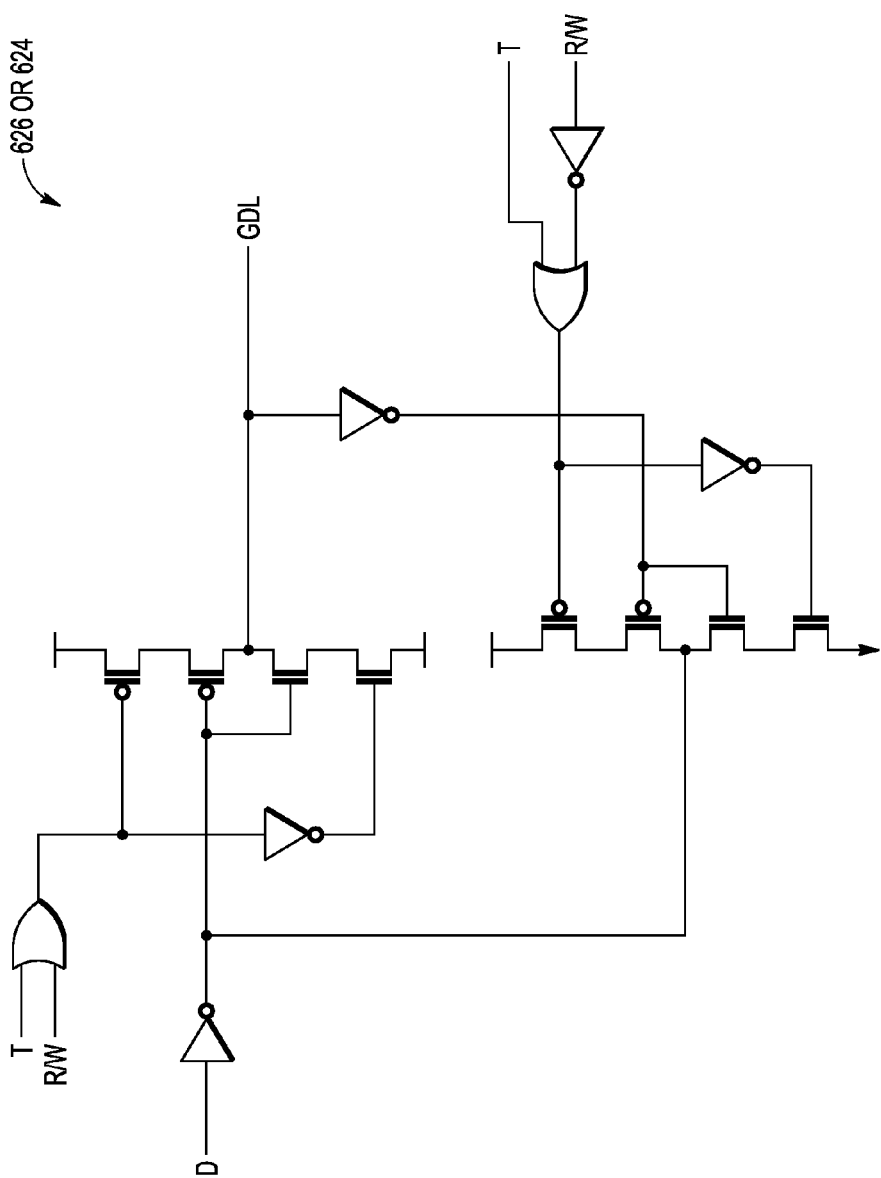
FIG. 7 is a combination logic and circuit diagram of the R/W switches of the I/O circuitry of FIG. 6 according to an embodiment.

FIG. 7 illustrates an example implementation of transmission circuitry 626 or 624, in which the signals T, R/W, D, and GDL correspond to either TA, the output of AND gate 618, DA, and GDLA of FIG. 6 or to TB, the output of AND gate 622, DB, and GDLB of FIG. 6. Transmission circuitry 626 and 624 are capable of being tri-stated (when T is a logic level one) in which D and GDL are held at high impedance or, when not in tri-state mode (when T is a logic level zero), allow for bidirectional communication between D and GDL, based on the value of R/W. For example, using transmission circuitry 624 as an example, if T is negated (i.e. a logic level zero) and R/W is a logic level one (indicating read), then the value of GDLB is provided as DB to the input of ARB 632 and the first terminal of transmission gate 630. If T is negated and R/W is a logic level zero (indicating a write), then the value of DB is provided to GDLB. However, if T is asserted (i.e. a logic level one), then the transmission circuitry is in tri-state mode in which DB and GDLB are held at high impedance.

In operation, when there is no row match, or when there is a row match but not a column match, GDLB communicates with I/O latches B 638 by way of R/W transmission circuitry 624 to perform the access request on port B and GDLA communicates with I/O latches 640 by way of R/W transmission circuitry 626 to perform the access request on port A. However, when there is a row match and a column match, either AFIRST or BFIRST is a logic level one. Note that that results in either XFIRST or YFIRST being asserted, as was described above in reference to FIG. 2, in which one of XFIRST or YFIRST is a logic level one is asserted is based on the value of PA. Also, with both a row match and a column match, MATCHRC is a logic level one. In this case, one of R/W transmission circuitry 624 or R/W transmission circuitry 626 is disabled and placed in high impedance mode such that only one R/W transmission circuitry is shared by port A and port B. For example, if AFIRST is asserted (and MATCHRC is a logic level one), then the output of AND gate 610 is a logic level one, thus asserting TB at the T input of transmission circuitry 624, placing it in tri-state mode. In this case, GDLB and DB are held at high impedance. Also, if AFIRST is asserted, then BFIRST is a logic level zero, and the output of AND gate 616 is a logic level zero, thus negating TA at the T input of transmission circuitry 626, thus allowing transmission circuitry 626 to communicate data between DA and GDLA based on the output of AND gate 618. (Analogous descriptions apply in the case of BFIRST being asserted in which transmission circuitry 624 would be enabled to communicate data between DB and GDLB based on its R/W input and transmission circuitry 626 would be placed in tri-state mode.)

Continuing with the example in which AFIRST is a logic level one and MATCHRC is a logic level one, port A and port B both share transmission circuitry 626 for performing its read or write. It is also assumed that both port A and port B cannot both be performing a write to the same location (which thus resulted in the row and column match). Therefore, port A and port B, at the time a row and column match occurs, may either be performing a read and a read, respectively, a read and write, respectively, or a write and a read, respectively. In the case of both ports performing a read, R/WA and R/WB are both logic level ones. Therefore, the output of NAND gate 620 is a logic level one (since R/WBb, the complement of R/WB, is a logic level zero) and the output of AND gate 618 is a logic level one. Transmission circuitry 626 is thus enabled to provide the values of GDLA to DA. The value of DA is provided through ARB 634 to I/O latches A 640 and I/O buffers A 648 to be provided as DOUTA. ARB 634, in this case, is enabled by MATCHRC and ADONE both being a logic level one. Also, since both ports A and B are reading to the same location, the value of DA is also provided via transmission gate 630 (enabled since MATCHRC is a logic level one) to I/O latches B 638 and I/O buffers B 646 to be provided as DOUTB. Therefore, as was described above, only one of the X-circuitry or Y-circuitry is used to access the same data location, and the data (originally from either GDLY or GDLX) is then provided as the output of both ports A and B.

Continuing with the above example, in the case of port A performing a write and port B performing a read, R/WA is a logic level zero and R/WB is a logic level one. In this case, the output of AND gate 618 is a logic level zero. Transmission circuitry 626 is thus enabled to perform a write in which the values of DA are provided to GDLA. In this example, since port A is performing a write, DINA is provided through ARB 634 and via I/O buffers A 648 and I/O latches A 640 as DA to GDLA. ARB 634 is enabled, in this case, by MATCHRC and ADONE both being a logic level one. Furthermore, GDLA is provided as either GDLX or GDLY by crossbar switch 604 based on the value of PA. Also, since port B is performing a read to the same location that port A is writing, port B need not read the value from the bit cell itself. Instead, the write value from port A provided as DINA can be provided as the read value, DOUTB, for port B. In this case, the value of DA is also provided, via transmission gate 630, as DB to I/O latches B 638 and I/O buffers B 646 to be provided as DOUTB. That is, note that DA and DB form a common bus when transmission gate 630 is enabled by the assertion of MATCHRC.

Continuing with the above example, in the case of port A performing a read and port B performing a write, R/WA is a logic level one and R/WB is a logic level zero. In this case, the output of AND gate 618 is again a logic level zero thus enabling transmission circuitry 626 to perform a write in which the values of DA are provided to GDLA. Since port B is performing a write, DINB is provided via I/O buffers B 646 and I/O latches B 638 as DB. Since DB forms a common bus with DA via transmission gate 630, DB is provided as DA which is provided to GDLA via transmission circuitry 626. Furthermore, GDLA is provided as either GDLX or GDLY by crossbar switch 604 based on the value of PA. Also, since port A is performing a read to the same location that port B is writing, port A need not read the value from the bit cell itself. Instead, the write value from port B provided as DINB can be provided as the read value, DOUTA, for port A. In this case, the value of DB is also provided, via transmission gate 630, as DA to I/O latches A 640 and I/O buffers A 648 to be provided as DOUTA.

Note that analogous operation occurs in the case of a row match and a column match in which BFIRST is asserted. In this case, for each situation described above (a read on both ports A and B, a write on port A and a read on port B, or a read on port A and a write on port B), transmission circuitry 624 would be shared. In the case of both ports performing a read, the data from GDLB via transmission circuitry 624 would be provided as both DOUTB and DOUTA. In the case of a read on port A and a write on port B, DINB would be provided as GDLB via transmission circuitry 624 and provided by the common bus formed by transmission gate 630 as DA to be provided as DOUTA. In the case of a write on port A and a read on port B, DINA would be provided as GDLB via transmission gate 630 and transmission circuitry 624 and would also be provided as DOUTB.

Note that DB is provided both to I/O latches B 638 and to ARB 632 which is also coupled to the output of OR gate 631, and DA is provided to I/O latches A 640 and to ARB 634 which is also coupled to the output of OR gate 627. The arbiters are used in the situation in which one port is performing a read and a late write occurs which results in a match. In this situation, the arbiters are designed so that they either choose to provide the read data that is read from the bit cell of array 146 and provided by one of GDLY or GDLX (based on PA) or the to provide the write data received at the other port corresponding to the late write. The arbiter may be designed such that if a later write to a same location is received within a predetermined time of the earlier read on the other port, then the write data is provided as the read data at the other port, else the read data read from array 146 itself is provided as the read data at the other port. The timing for the arbitrator and latching the output of the arbitrator into the I/O latch is done when the signal BDONE for port B or ADONE for port A is asserted. For example, in the above example in which port B is a write and port A is a read, port A may have been performing its read first when the write at port B is received. At the time ADONE is asserted, then ARB 634 may direct the read data DA received from transmission circuitry 626 to I/O latches A 640 to be output as DOUTA. However, if the data DA is in transition due to a late write driving the bus, the value on DA may be indeterminate and the arbiter forces a decision as to whether read data or write data is written to I/O latches A 640 and outputted as DOA to I/O buffers A 648.

Therefore, by now it can be appreciated how a multiple port memory may be interfaced with asynchronous circuitry such that the ports of the multiple port memory can operate according to different clocks. Each bit cell of the memory can be accessed by different sets of word lines and bit lines, in which each port of the memory can be assigned to a particular set of word lines and bit lines for performing its read and write access requests to the memory. In the case of a row match but not a column match between access requests on multiple ports, a particular set of word lines and bit lines may be shared by the multiple ports. However, if the port currently assigned to the shared set of word lines and bit lines needs to access a different row, the port assignments may be toggled so that the port can use a different (non-shared) set of word lines and bit lines rather than wait for the shared set of word lines and bit lines to be free. This toggling of the port assignments prevents occurrence of increased access latencies or wait states.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. For example the invention was described in the context of two ports, it may be applied to memory architectures in which there are more than two ports. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present disclosure.

Item 1 includes a method of operating a multiple port static random access memory (SRAM) having an array of bit cells arranged in rows and columns, a first port and a second port, a first row circuit coupled to the first port, a second row circuit coupled to the second port, a first column circuit coupled to the first port, a second column circuit coupled to the second port, a first plurality of word lines along the rows and a first plurality of bit lines along the columns working together to perform accesses to the array, and a second plurality of word lines along the rows and a second plurality of bit lines along the columns working together to perform accesses to the array, wherein each bit cell of the array is coupled to a word line from the first plurality of word lines and a word line from the second plurality of word lines. The method includes, during a first period of operation in which the rows being accessed by the first port are different than the rows being accessed by the second port, having a correlation in which the first port accesses the array using the first plurality of word lines and the first plurality of bit lines and the second port accesses the array using the second plurality of word lines and the second plurality of bit lines; in response to the second port switching to a row address that is the same as the row address of the first port, accessing the array for the second port using the first plurality of word lines and the first plurality of bit lines; and if the first port switches to a different row address prior to the second port switching to a different row address, performing a correlation swap so that the first port accesses the array using the second plurality of word lines and the second plurality of bit lines and the second port accesses the array using the first plurality of word lines and the first plurality of bit lines. Item 2 includes the method of item 1, wherein, if the second port switches to a different row address prior to the first port switching to a different row address, maintaining the correlation so that the first port accesses the array using the first plurality of word lines and the first plurality of bit lines and the second port accesses the array using the second plurality of word lines and the second plurality of bit lines. Item 3 includes the method of item 2, if the correlation swap is performed and there is a subsequent occurrence of the second port switching to a same row address as the first port, accessing the array for the first port and the second port using the second plurality of word lines and the second plurality of bit lines. Item 4 includes the method of item 3, and further includes, if after accessing the array for the first port and the second port using the second plurality of word lines and the second plurality of bit lines, the first port switches to a different row address prior to the second port switching to a different address, performing a correlation swap so that the first port accesses the array using the first plurality of word lines and the first plurality of bit lines and the second port performs accesses using the second plurality of word lines and the second plurality of bit lines. Item 5 includes the method of item 3, wherein, if after accessing the array for the first port and the second port using the second plurality of word lines and the second plurality of bit lines, the second port switches to a different row address prior to the first port switching to a different address, correlation of the first port accessing the array using the second plurality of word lines and the second plurality of bit lines and the second port accessing the array using the first plurality of word lines and the first plurality of bit lines is maintained. Item 6 includes the method of item 1, wherein, if the row addresses are different, accessing further includes accessing the first plurality of bit lines with a first read/write circuit and the second plurality of bit lines with a second read/write circuit. Item 7 includes the method of item 6, wherein, if the correlation swap occurs different accessing further includes accessing the first plurality of bit lines with a second read write circuit and the second plurality of bit lines with a first read write circuit. Item 8 includes the method of item 2, wherein, if the correlation swap is performed and an occurrence of the first port switching to the same row address as the second port, accessing the array for the first port and the second port using the first plurality of word lines and the first plurality of bit lines. Item 9 includes the method of item 1, wherein if the row address is the same for the first and second ports and a column address is the same for the first and second ports and the access is a read, using first column circuit to perform the read and providing results of the read for the first port and for the second port. Item 10 includes the method of item 1, if the correlation swap has been performed, coupling the second row circuit to the first plurality of word lines, the second column circuit to the first plurality of bit lines, the first row circuit to the second plurality of word lines, and the first column circuit to the second plurality of bit lines.

Item 11 includes a multiport static random access memory (SRAM) having a first correlation and a second correlation, and having a first port having a first row address buffer for receiving a first row address, a first column address buffer for receiving a first column address, and a first input/output buffer; a second port having a second row address buffer for receiving a second row address, a second column address buffer for receiving a second column address; and a second input/output buffer; an array of memory cells arranged in rows and columns; a first plurality of word lines along the rows and a first plurality of bit lines along the columns working together to perform accesses to the array, wherein each memory cell of the array of memory cells is coupled to a word line of the first plurality of word lines; a second plurality of word lines along the rows and a second plurality of bit lines along the columns working together to perform accesses to the array, wherein each memory cell of the array of memory cells is coupled to a word line of the second plurality of word lines; column circuitry coupled to the first and second plurality of bit lines; a column switch coupled to outputs of the first column address buffer and the second column address buffer and coupled to the column circuitry; a row switch coupled to an output of the first row address buffer and an output of the second row address buffer; a first row decoder coupled to the first plurality of word lines and a first output of the row switch; and a second row decoder coupled to the second plurality of word lines and a second output of the row switch, wherein: in the first correlation: the column switch couples the output of the first column address buffer to a first input of the column circuitry and couples the output of the second column address buffer to a second input of the column circuitry, in the second correlation: the row switch couples the output of the first address buffer to the second row decoder and the output of the second address buffer to the first row decoder; and the column switch couples the output of the first column address buffer to the second input of the column circuitry and couples the output of the second column address buffer to the first input of the column circuitry. Item 12 includes the multiport SRAM of item 11, in response to a row match in which the second row address becomes the same as the first row address when in the first correlation, the column circuitry decouples from the second plurality of bit lines and accesses a bit line pair of the first plurality of bit lines selected by the second column address. Item 13 includes the multiport SRAM of item 12, wherein the column circuitry is further characterized as having a first data line pair and a second data line pair in which, during the first correlation and the second correlation in the absence of a row match, the bit line pair of the first plurality of bit lines selected by the first column address is coupled to the first data line pair and a bit line pair of the second plurality of bit lines selected by the second column address is coupled to the second data line pair. Item 14 includes the multiport SRAM of item 13, wherein, in response to the row match in which the second row address becomes the same as the first row address in the first correlation, the column circuitry couples the bit line pair of the first plurality of bit lines selected by the second column address to the second data line pair. Item 15 includes the multiport SRAM of item 14, wherein the column circuitry further includes a write driver and a sense amplifier circuit coupling the first data line pair to first global data lines and the second data line pair to second global data lines. Item 16 includes the multiport SRAM of item 15, wherein the first port further includes a first input/output circuit and the second port further includes a second input/output circuit, the multiport SRAM further includes a crossbar switch that couples the first global data lines to the first input/output circuit and the second global data lines to the second input/output circuit in the first correlation and the first global data lines to the second input/output circuit and the second global data lines to the first input/output circuit in the second correlation. Item 17 includes the multiport SRAM of item 12, in response to removing the row match by changing the first row address, the multiport SRAM switches to the second correlation. Item 18 includes the multiport SRAM of item 12, in response to removing the row match by changing the second row address, the multiport SRAM remains in the first correlation. Item 19 includes the multiport SRAM of item 13, wherein a column match is present in addition to a row match, the bit line pair from the first plurality of the bit line pairs selected by both the first column address and the second column address is coupled to only the first data line.

Item 20 includes a method of operating a multiple port static random access memory (SRAM) having an array of memory cells arranged in rows and columns, a first port and a second port, a first plurality of word lines along the rows and a first plurality of bit lines along the columns working together to perform accesses to the array, and a second plurality of word lines along the rows and a second plurality of bit lines along the columns working together to perform accesses to the array, wherein each bit cell of the array is coupled to a word line from the first plurality of word lines and a word line from the second plurality of word lines. The method includes during a first period of operation in which the rows being accessed by the first port are different than the rows being accessed by second port, using the first plurality of word lines and the first plurality of bit lines to access the array for the first port and the second plurality of word lines and bit lines to access the array for the second port; in response to the second port switching to a row address that is the same as the row address of the first port, accessing the array for the second port using the first plurality of word lines and the first plurality of bit lines; and in response to the first port switching to a different row address prior to the second port switching to a different row address, accessing the array for the first port using the second plurality of word lines and the second plurality of bit lines and accessing the array for the second port using the first plurality of word lines and the first plurality of bit lines.

What is claimed is:

1. A method of operating a multiple port static random access memory (SRAM) having an array of bit cells arranged in rows and columns, a first port and a second port, a first row circuit coupled to the first port, a second row circuit coupled to the second port, a first column circuit coupled to the first port, a second column circuit coupled to the second port, a first plurality of word lines along the rows and a first plurality of bit lines along the columns working together to perform accesses to the array, and a second plurality of word lines along the rows and a second plurality of bit lines along the columns working together to perform accesses to the array, wherein each bit cell of the array is coupled to a word line from the first plurality of word lines and a word line from the second plurality of word lines, comprising:
    during a first period of operation in which the rows being accessed by the first port are different than the rows being accessed by the second port, having a correlation in which the first port accesses the array using the first plurality of word lines and the first plurality of bit lines and the second port accesses the array using the second plurality of word lines and the second plurality of bit lines;
    in response to the second port switching to a row address that is the same as the row address of the first port, accessing the array for the second port using the first plurality of word lines and the first plurality of bit lines; and
    if the first port switches to a first different row address prior to the second port switching to a second different row address, performing a correlation swap so that the first port accesses the array using the second plurality of word lines and the second plurality of bit lines and the second port accesses the array using the first plurality of word lines and the first plurality of bit lines.

2. The method of claim 1, wherein, if the second port switches to the second different row address prior to the first port switching to the first different row address, maintaining the correlation so that the first port accesses the array using the first plurality of word lines and the first plurality of bit lines and the second port accesses the array using the second plurality of word lines and the second plurality of bit lines.

3. The method of claim 2, if the correlation swap is performed and there is a subsequent occurrence of the second port switching to a same row address as the first port, accessing the array for the first port and the second port using the second plurality of word lines and the second plurality of bit lines.

4. The method of claim 3, further comprising, if after accessing the array for the first port and the second port using the second plurality of word lines and the second plurality of bit lines, the first port switches to a third different row address prior to the second port switching to a fourth different address, performing a correlation swap so that the first port accesses the array using the first plurality of word lines and the first plurality of bit lines and the second port performs accesses using the second plurality of word lines and the second plurality of bit lines.

5. The method of claim 3, wherein, if after accessing the array for the first port and the second port using the second plurality of word lines and the second plurality of bit lines, the second port switches to a third different row address prior to the first port switching to a fourth different address, the correlation of the first port accessing the array using the second plurality of word lines and the second plurality of bit lines and the second port accessing the array using the first plurality of word lines and the first plurality of bit lines is maintained.

6. The method of claim 1, wherein the first plurality of bit lines are accessed with a first read/write circuit and the second plurality of bit lines are accessed with a second read/write circuit.

7. The method of claim 6, wherein, if the correlation swap occurs, the first plurality of bit lines are accessed with the second read write circuit and the second plurality of bit lines are accessed with the first read write circuit.

8. The method of claim 2, wherein, if the correlation swap is performed and an occurrence of the first port switching to a same row address as the second port, accessing the array for the first port and the second port using the first plurality of word lines and the first plurality of bit lines.

9. The method of claim 1, wherein if the second port switches to a same row address as the first port and a same column address as the first port, using first column circuit to perform the read and providing results of the read for the first port and for the second port.

10. The method of claim 1, if the correlation swap has been performed, coupling the second row circuit to the first plurality of word lines, the second column circuit to the first plurality of bit lines, the first row circuit to the second plurality of word lines, and the first column circuit to the second plurality of bit lines.

11. A multiport static random access memory (SRAM) having a first correlation and a second correlation, comprising:
    a first port having a first row address buffer for receiving a first row address, a first column address buffer for receiving a first column address, and a first input/output buffer;
    a second port having a second row address buffer for receiving a second row address, a second column address buffer for receiving a second column address; and a second input/output buffer;
    an array of memory cells arranged in rows and columns;
    a first plurality of word lines along the rows and a first plurality of bit lines along the columns working together to perform accesses to the array, wherein each memory cell of the array of memory cells is coupled to a word line of the first plurality of word lines;
    a second plurality of word lines along the rows and a second plurality of bit lines along the columns working together to perform accesses to the array, wherein each memory cell of the array of memory cells is coupled to a word line of the second plurality of word lines;
    column circuitry coupled to the first and second plurality of bit lines;
    a column switch coupled to outputs of the first column address buffer and the second column address buffer and coupled to the column circuitry;
    a row switch coupled to an output of the first row address buffer and an output of the second row address buffer;
    a first row decoder coupled to the first plurality of word lines and a first output of the row switch; and
    a second row decoder coupled to the second plurality of word lines and a second output of the row switch,
    wherein:
    in the first correlation:
        the column switch couples the output of the first column address buffer to a first input of the column circuitry and couples the output of the second column address buffer to a second input of the column circuitry,
    in the second correlation:
        the row switch couples the output of the first row address buffer to the second row decoder and the output of the second row address buffer to the first row decoder; and
        the column switch couples the output of the first column address buffer to the second input of the column circuitry and couples the output of the second column address buffer to the first input of the column circuitry.

12. The multiport SRAM of claim 11, in response to a row match in which the second row address becomes the same as the first row address when in the first correlation, the column circuitry decouples from the second plurality of bit lines and accesses a bit line pair of the first plurality of bit lines selected by the second column address.

13. The multiport SRAM of claim 12, wherein the column circuitry is further characterized as having a first data line pair and a second data line pair in which, during the first correlation and the second correlation when no row match is present, the bit line pair of the first plurality of bit lines selected by the first column address is coupled to the first data line pair and a bit line pair of the second plurality of bit lines selected by the second column address is coupled to the second data line pair.

14. The multiport SRAM of claim 13, wherein, in response to the row match in which the second row address becomes the same as the first row address in the first correlation, the column circuitry couples the bit line pair of the first plurality of bit lines selected by the second column address to the second data line pair.

15. The multi-port SRAM of claim 14, wherein the column circuitry further comprises a write driver and a sense amplifier circuit coupling the first data line pair to first global data lines and the second data line pair to second global data lines.

16. The multiport SRAM of claim 15, wherein the first port further comprises a first input/output circuit and the second port further comprises a second input/output circuit, the multiport SRAM further comprising a crossbar switch that couples the first global data lines to the first input/output circuit and the second global data lines to the second input/output circuit in the first correlation and the first global data lines to the second input/output circuit and the second global data lines to the first input/output circuit in the second correlation.

17. The multiport SRAM of claim 12, in response to removing the row match by changing the first row address, the multiport SRAM switches to the second correlation.

18. The multiport SRAM of claim 12, in response to removing the row match by changing the second row address, the multiport SRAM remains in the first correlation.

19. The multiport SRAM of claim 13, wherein if a column match is present in addition to the row match, the bit line pair from the first plurality of the bit line pairs selected by both the first column address and the second column address is coupled to only a first data line.

20. A method of operating a multiple port static random access memory (SRAM) having an array of memory cells arranged in rows and columns, a first port and a second port, a first plurality of word lines along the rows and a first plurality of bit lines along the columns working together to perform accesses to the array, and a second plurality of word lines along the rows and a second plurality of bit lines along the columns working together to perform accesses to the array, wherein each bit cell of the array is coupled to a word line from the first plurality of word lines and a word line from the second plurality of word lines, comprising:

during a first period of operation in which the rows being accessed by the first port are different than the rows being accessed by second port, using the first plurality of word lines and the first plurality of bit lines to access the array for the first port and the second plurality of word lines and bit lines to access the array for the second port;

in response to the second port switching to a row address that is the same as the row address of the first port, accessing the array for the second port using the first plurality of word lines and the first plurality of bit lines; and in response to the first port switching to a first different row address prior to the second port switching to a second different row address, accessing the array for the first port using the second plurality of word lines and the second plurality of bit lines and accessing the array for the second port using the first plurality of word lines and the first plurality of bit lines.

* * * * *